United States Patent
Zhang et al.

(10) Patent No.: US 11,309,502 B2
(45) Date of Patent: Apr. 19, 2022

(54) DISPLAY PANEL HAVING STRETCHABLE BRIDGES CONNECTING ISLAND-SHAPED STRUCTURES AND DISPLAY DEVICE THEREOF

(71) Applicant: Shanghai Tianma Micro-Electronics Co., Ltd., Shanghai (CN)

(72) Inventors: Jun Zhang, Shanghai (CN); Ming Yang, Shanghai (CN); Yingteng Zhai, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 45 days.

(21) Appl. No.: 16/926,109

(22) Filed: Jul. 10, 2020

(65) Prior Publication Data

US 2021/0376267 A1    Dec. 2, 2021

(30) Foreign Application Priority Data

May 29, 2020    (CN) .......................... 202010475476.6

(51) Int. Cl.
*H01L 51/00* (2006.01)
*H01L 27/14* (2006.01)
*H01L 27/32* (2006.01)
*H01L 27/146* (2006.01)

(52) U.S. Cl.
CPC ...... *H01L 51/0097* (2013.01); *H01L 27/3244* (2013.01); *H01L 27/14678* (2013.01); *H01L 27/323* (2013.01); *H01L 2251/5338* (2013.01)

(58) Field of Classification Search
CPC ......... H01L 51/0097; H01L 2251/5338; H01L 27/3244; H01L 27/14678
See application file for complete search history.

(56) References Cited

U.S. PATENT DOCUMENTS

| | | | |
|---|---|---|---|
| 6,379,510 B1 * | 4/2002 | Kane | B81C 1/00142 204/192.27 |
| 10,224,495 B2 * | 3/2019 | Sasaki | H01L 27/3276 |
| 10,504,936 B2 * | 12/2019 | Park | H01L 27/1218 |
| 10,649,496 B2 * | 5/2020 | Choi | G06F 1/1652 |
| 10,651,265 B2 * | 5/2020 | Park | H01L 51/5256 |

(Continued)

FOREIGN PATENT DOCUMENTS

| | | |
|---|---|---|
| CN | 110047380 A | 7/2019 |
| CN | 110444112 A | 11/2019 |

*Primary Examiner* — Ida M Soward
(74) *Attorney, Agent, or Firm* — Anova Law Group, PLLC

(57) ABSTRACT

A display panel and a display device are provided. The display panel includes a stretchable display area; and the stretchable display area includes a plurality of island-shaped structures and a plurality of stretchable bridges. A stretchable bridge of the plurality of stretchable bridges is configured to connect adjacent island-shaped structures of the plurality of island-shaped structures; at least one pixel is disposed on an island-shaped structure of the plurality of island-shaped structures; the stretchable display area includes a first stretchable display area and a second stretchable display area adjacent to the first stretchable display area; the first stretchable display area is disposed corresponding to an under-screen camera; and a stretchable degree of the first stretchable display area is greater than a stretchable degree of the second stretchable display area.

25 Claims, 16 Drawing Sheets

(56) References Cited

U.S. PATENT DOCUMENTS

| | | | |
|---|---|---|---|
| 10,684,716 B2* | 6/2020 | Zhai | H01L 27/323 |
| 10,748,982 B2* | 8/2020 | Hong | H01L 27/322 |
| 10,964,769 B2* | 3/2021 | Park | H01L 27/3276 |
| 11,011,599 B2* | 5/2021 | Kim | H01L 51/5281 |
| 11,037,478 B2* | 6/2021 | Ahn | G09G 3/3225 |
| 11,038,130 B2* | 6/2021 | Liu | H01L 27/3276 |
| 2009/0283891 A1* | 11/2009 | Dekker | H05K 1/0283 257/690 |
| 2010/0002402 A1* | 1/2010 | Rogers | H05K 1/028 361/749 |
| 2014/0299362 A1* | 10/2014 | Park | H05K 1/0283 174/254 |
| 2016/0049602 A1* | 2/2016 | Kim | H01L 51/5206 257/40 |
| 2016/0293571 A1* | 10/2016 | Yoon | H01L 27/3276 |
| 2017/0086291 A1* | 3/2017 | Cotton | H02S 40/36 |
| 2019/0341433 A1* | 11/2019 | Im | H01L 27/3276 |
| 2020/0137472 A1* | 4/2020 | Won | H04R 3/12 |
| 2020/0161276 A1* | 5/2020 | Kim | G09F 9/301 |
| 2020/0168824 A1* | 5/2020 | Park | G09F 9/301 |
| 2020/0212117 A1* | 7/2020 | Jeon | H01L 51/5237 |
| 2020/0371641 A1* | 11/2020 | Zhai | G06F 3/0412 |
| 2021/0026411 A1* | 1/2021 | Ke | G06F 1/1652 |
| 2021/0027674 A1* | 1/2021 | Niu | H01L 51/003 |
| 2021/0104579 A1* | 4/2021 | Zhang | H01L 51/0011 |
| 2021/0135133 A1* | 5/2021 | Zhu | H01L 51/56 |
| 2021/0175448 A1* | 6/2021 | Ban | H01L 27/3276 |
| 2021/0210523 A1* | 7/2021 | Sui | H01L 27/32 |

* cited by examiner

DISPLAY PANEL HAVING STRETCHABLE BRIDGES CONNECTING ISLAND-SHAPED STRUCTURES AND DISPLAY DEVICE THEREOF

CROSS-REFERENCES TO RELATED APPLICATIONS

This application claims priority of Chinese Patent Application No. 202010475476.6, filed on May 29, 2020, the entire contents of which are hereby incorporated by reference.

FIELD OF THE DISCLOSURE

The present disclosure generally relates to the field of display technology and, more particularly, relates to a display panel and a display device.

BACKGROUND

With the development of display technology, display devices with camera configured at bottom of the display screen have been gradually adopted to reduce the bezel of the display screen, and achieve a true full-screen display. An existing solution is to sacrifice the pixel density of the camera area to improve the light transmittance of the camera area. This, however, cannot allow images/videos to be captured with high-definition.

Therefore, there is a need to provide a display panel and a display device that are able to capture high-definition image/video. The disclosed display panel, and display device are directed to solve one or more problems set forth above and other problems in the art.

BRIEF SUMMARY OF THE DISCLOSURE

One aspect of the present disclosure provides a display panel. The display panel includes a stretchable display area; and the stretchable display area includes a plurality of island-shaped structures and a plurality of stretchable bridges. A stretchable bridge of the plurality of stretchable bridges is configured to connect adjacent island-shaped structures of the plurality of island-shaped structures; at least one pixel is disposed on an island-shaped structure of the plurality of island-shaped structures; the stretchable display area includes a first stretchable display area and a second stretchable display area adjacent to the first stretchable display area; the first stretchable display area is disposed corresponding to an under-screen camera; and a stretchable degree of the first stretchable display area is greater than a stretchable degree of the second stretchable display area.

Another aspect of the present disclosure provides a display device. The display device includes a display panel. The display panel includes a stretchable display area; and the stretchable display area includes a plurality of island-shaped structures and a plurality of stretchable bridges. A stretchable bridge of the plurality of stretchable bridges is configured to connect adjacent island-shaped structures of the plurality of island-shaped structures; at least one pixel is disposed on an island-shaped structure of the plurality of island-shaped structures; the stretchable display area includes a first stretchable display area and a second stretchable display area adjacent to the first stretchable display area; the first stretchable display area is disposed corresponding to an under-screen camera; and a stretchable degree of the first stretchable display area is greater than a stretchable degree of the second stretchable display area.

Other aspects of the present disclosure can be understood by those skilled in the art in light of the description, the claims, and the drawings of the present disclosure.

BRIEF DESCRIPTION OF THE DRAWINGS

The following drawings are incorporated in and constitute a part of the specification, illustrating embodiments of the present disclosure, and together with the detailed descriptions serve to explain the mechanism of the present disclosure. Obviously, the drawings in the following description are only exemplary embodiments of the present disclosure. For those of ordinary skill in the art, without paying creative labor, other drawings can be obtained according to the provided drawings.

DETAILED DESCRIPTION

Reference will now be made in detail to exemplary embodiments of the disclosure, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all the embodiments of the present disclosure. Based on the disclosed embodiments, persons of ordinary skill in the art may derive other embodiments consistent with the present disclosure, all of which are within the scope of the present disclosure.

Figure 1:
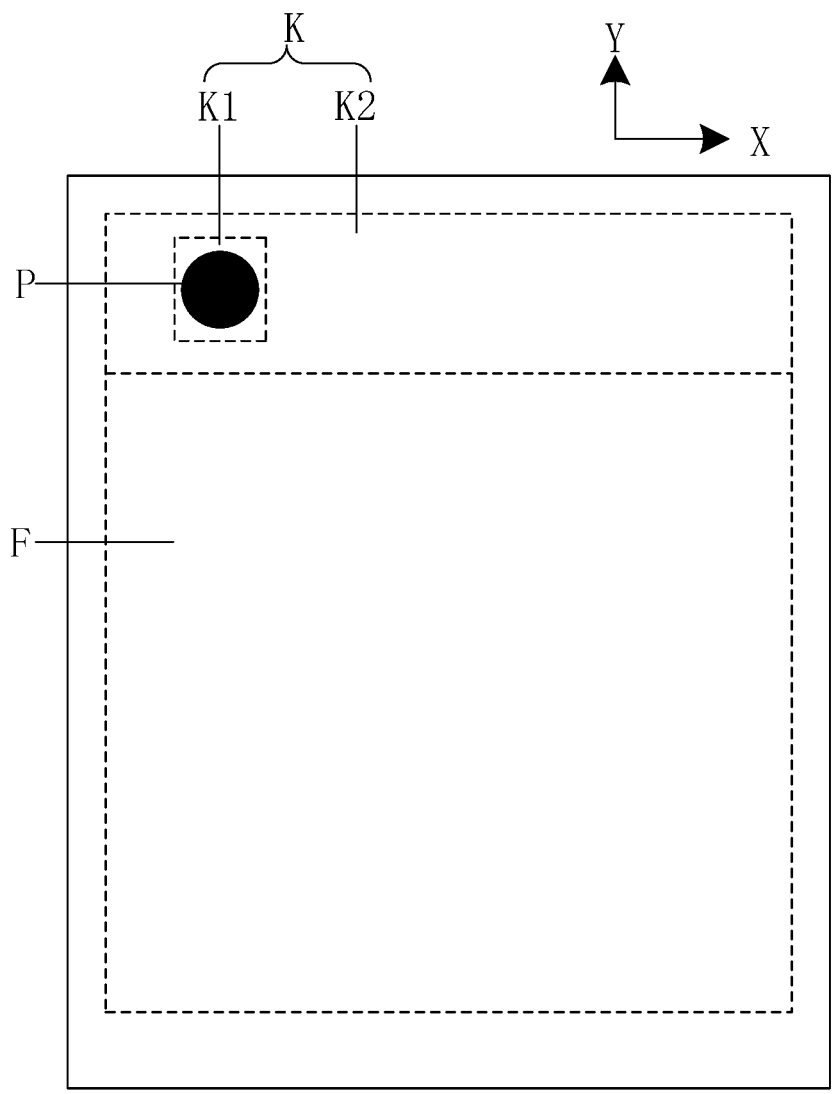
FIG. 1 illustrates a top view of an exemplary display panel consistent with various disclosed embodiments of the present disclosure.

The present disclosure provides a display panel. FIG. 1 illustrates a top view of an exemplary display panel consistent with various disclosed embodiments of the present disclosure.

As shown in FIG. 1, the display panel may include a display area and a non-display area. The display area may include a stretchable display area K and a non-stretchable area F. The stretchable display area K may include a first stretchable display area K1 and a second stretchable display area K2 adjacent to the first stretchable display area K1. The first stretchable display K1 may be disposed corresponding to an under-screen camera P.

The under-screen camera P may mean that the camera is disposed under the array substrate of the display panel. The light reflected by the to-be-photographed object may need to pass through the gaps among pixels and other structures on the array substrate, or penetrate the pixels and other structures to enter the camera for imaging. In the present disclosure, by setting the camera under the screen or the array substrate, the width of the frame of the display panel may be reduced to realize a full-screen display.

Figure 2:
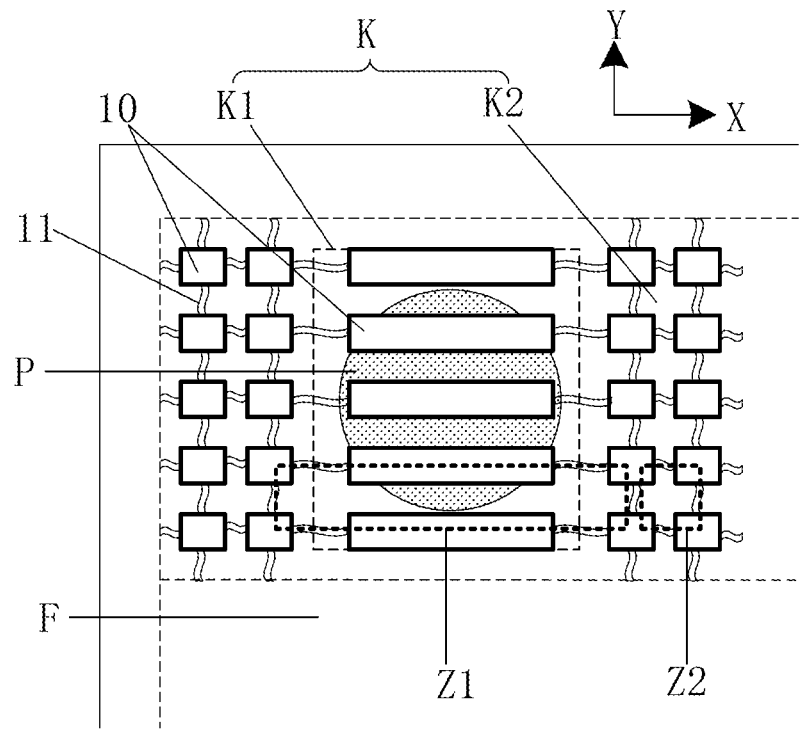
FIG. 2 illustrates a portion of an exemplary stretchable display region K consistent with various disclosed embodiments of the present disclosure.

FIG. 2 illustrates a schematic diagram of a portion of a stretchable display area K provided by the present disclosure. In one embodiment, as shown in FIG. 2, the stretchable display area K may include a plurality of island-shaped structures 10 and a plurality of stretchable bridges 11. A stretchable bridge 11 may connect adjacent island-shaped structures 10. At least one pixel may be disposed on an island-shaped structure 10. In particular, the substrate of the stretchable display area K may be divided into individual island-shaped structures 10, and an island-shaped structure 10 and an adjacent island-shaped structure 10 may be connected by a stretchable bridge 11.

Figure 3:
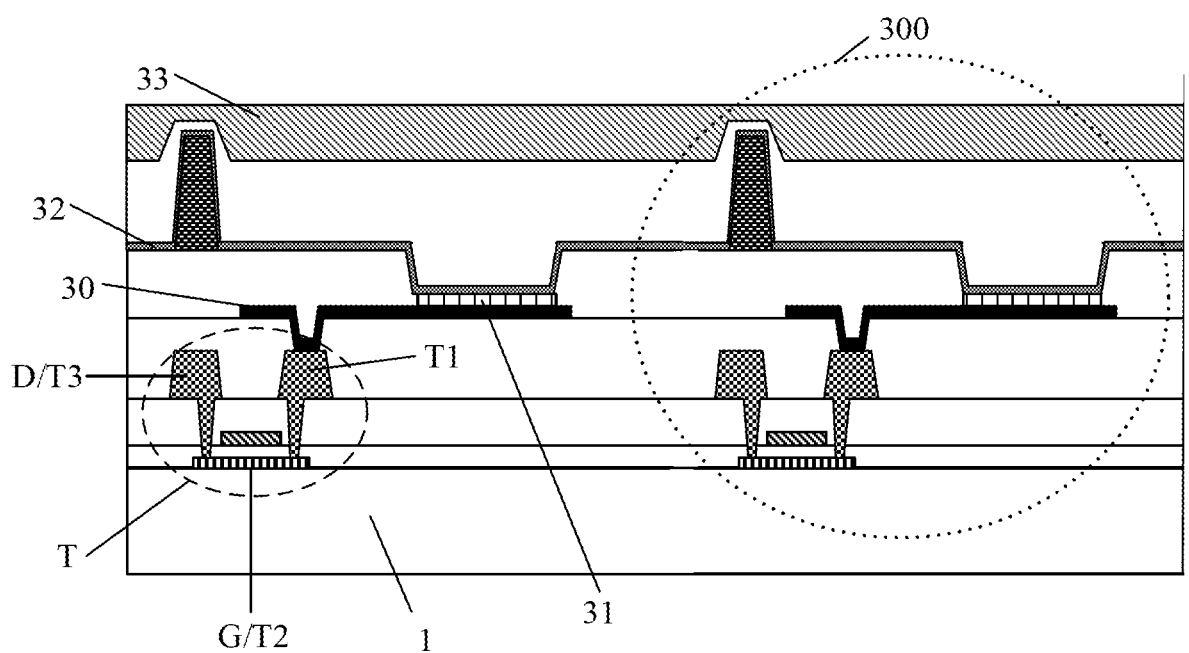
FIG. 3 illustrates a cross-sectional view of an exemplary display panel consistent with various disclosed embodiments of the present disclosure.

Further, at least one pixel may be disposed on an island-shaped structure 10. FIG. 3 illustrates a schematic cross-sectional view of another exemplary display panel provided by the present disclosure. For illustrative purposes, two pixels 300 are disposed on every island-shaped structure 10. The number of the island-shaped structures 10 disposed on each island-shaped structure 10 is not limited in the present disclosure.

As shown in FIG. 3, each pixel 300 may include a pixel driving circuit, a pixel electrode 30, a light-emitting element 31, a common electrode 32, and an encapsulation layer 33. The pixel driving circuit may include a thin-film transistor T disposed on the substrate 1 of the island-shaped structure 10. The drain T1 of the thin-film transistor T may be connected to the pixel electrode 30. The pixel electrode 30 may be electrically connected to one side of the light-emitting element 31, and the other side of the light-emitting element 31 may be electrically connected to the common electrode 32. After the gate line G transmits a scan signal to the driving circuit through the gate T2 of the thin-film transistor T, and the data line D transmits a data signal to the driving circuit through the source T3 of the thin-film transistor T, the driving circuit may provide a current to the light-emitting element 31 through the thin film-transistor T and the pixel electrode 30 to cause the light-emitting element 31 to emit light and display. The light-emitting element 31 may be a light-emitting diode, or an organic light-emitting diode, etc. Signal lines, such as gate lines and data lines, etc., connected to the pixel driving circuit may be disposed on the stretchable bridges 11, and the signal lines may extend along the stretchable bridges 11 and may not be connected to each other.

When the stretchable display area K is under a stretched state, the stretchable bridges 11 may be stretched and may drive the island-shaped structures 10 to move. Because the length of the stretchable bridge 11 may become greater under the stretched state, the opening area enclosed by any possible island-shaped structures and stretchable bridges may be increased, and the light transmittance of the region of the under-screen camera P may be increased.

When the stretchable display area K is under a non-stretched state, because the stretchable bridges 11 may have a smaller length under the non-stretched state, the opening area enclosed by the island-shaped structures 10 and the stretchable bridges 11 may be smaller. Thus, the density of the island-shaped structures 10 in the region of the under-screen camera P may be greater. Accordingly, the pixel density of the region of the under-screen camera P may be greater under the non-stretched state; and the pixel density of the region of the under-screen camera P may meet the requirements of high-resolution display and, under the non-stretched state, the light transmittance of the region of the under-screen camera P may meet the needs of high-definition shooting. It should be noted that, under the stretched state, the shapes and structures of the island-shaped structures 10 may be unchanged to ensure the stability of the structures, such as pixels, etc.

Figure 4:
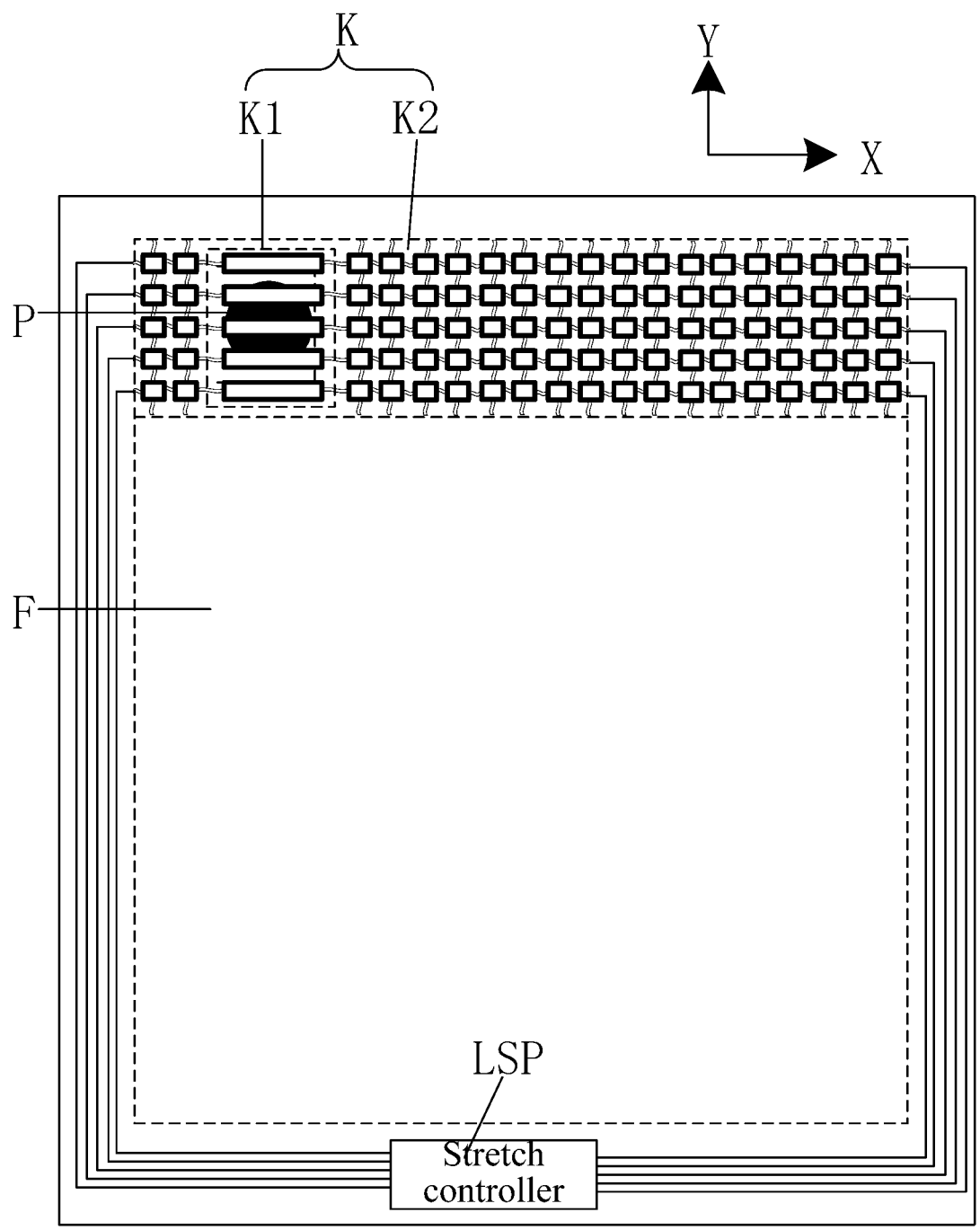
FIG. 4 illustrates a top view of an exemplary display panel consistent with various disclosed embodiments of the present disclosure.

FIG. 4 illustrates a top view of an exemplary display panel consistent with various disclosed embodiments of the present disclosure. As shown in FIG. 4, the display panel may further include a stretch controller LSP. The stretch controller LSP may control the stretchable display area K to be under the stretched state when the under-screen camera P is in operation, and may control the stretchable display area K to be under the non-stretched state when the under-screen camera P is not in operation. In particular, when the under-screen camera P is in the operation, for example, it is in the shooting mode, the stretchable display area K may be controlled to be under the stretched state to ensure that the light transmittance of the region of the under-screen camera P may meet the requirements of the high-definition shooting. When under-screen camera P is not in operation, for example, it is under a standby mode, the stretchable display area K may be controlled to be under the non-stretched state to ensure that the pixel density of the region of the under-screen camera P may meet the requirements of a high-resolution display.

It should be noted that the stretch controller LSP in the present disclosure may be integrated into the driving chip of the display panel, or may be integrated into a separated chip; and the position of the stretch controller LSP is not limited by the present disclosure. The chip having the stretch controller LSP may receive a signal input from the user through an input device of the display panel, such as a touch electrode, etc. The signal may indicate whether the under-screen camera P is in operation, and may control whether the stretch display area K is stretched.

It should also be noted that the stretch controller LSP in the present disclosure may also control the magnitude of the attractive force or the repulsive force between adjacent island-shaped structures 10 through a magnetic field to control the stretchable degree of the stretchable display area K. In some embodiments, the stretch controller LSP may also control the stretchable degree of the stretchable display area K through other methods, such as controlling the stretchable display area K through a spring, and other devices, etc. Further, in one embodiment, the current stretchable degree of the stretchable display area K may also be detected by a device, such as a sensor, etc., and the current stretchable degree may be sent to the stretch controller LSP such that the stretch controller LSP may adjust the degree of stretching of the stretch display area K.

In one embodiment, the stretchable degree of the first stretchable display area K1 may be greater than that of the second stretchable display area K2. Because the first stretchable display area K1 may correspond to the under-screen camera P, and the area adjacent to the first stretchable display area K1, e.g., the second stretchable display area K2, may also be stretchable. Thus, the stretching damage on the boundary area between the first stretchable display area K1 and the second stretchable display area K2 may be reduced. For example, if the area adjacent to the first stretchable display area K1 is a non-stretchable rigid area, the stretchable bridges 11 in the boundary area between the first stretchable display area K1 and the rigid area may receive a relatively large tensile force; and the damage to the stretchable bridges 11 may be greater after a long time or multiple-time stretching. In the present disclosure, by setting the second stretchable display area K2 adjacent to the first stretchable display area K1 to be a stretchable area, the cushioning and transition between the first stretchable display area K1 and other regions, such as non-stretchable rigid regions, may be achieved. Thus, the stretch damage to the structures, such as the stretchable bridges 11, etc., in the boundary region between the first stretchable display area K1 and other regions may be reduced.

Further, because the stretchable degree of the first stretchable display area K1 may be greater than that of the second stretchable display area K2, the light transmittance of the first stretchable display area K1 may be ensured to satisfy the needs of the high-definition shooting, while the pixel density of the second stretchable display area K2 may meet the requirements of the high-resolution display. Further, the stretching force on the display area away from the under-screen camera P may be gradually reduced. Accordingly, the stretch damage to the boundary area of the display area away from the under-screen camera P may be gradually reduced, and the stability and reliability of the stretchable display area K may be enhanced.

Figure 5:
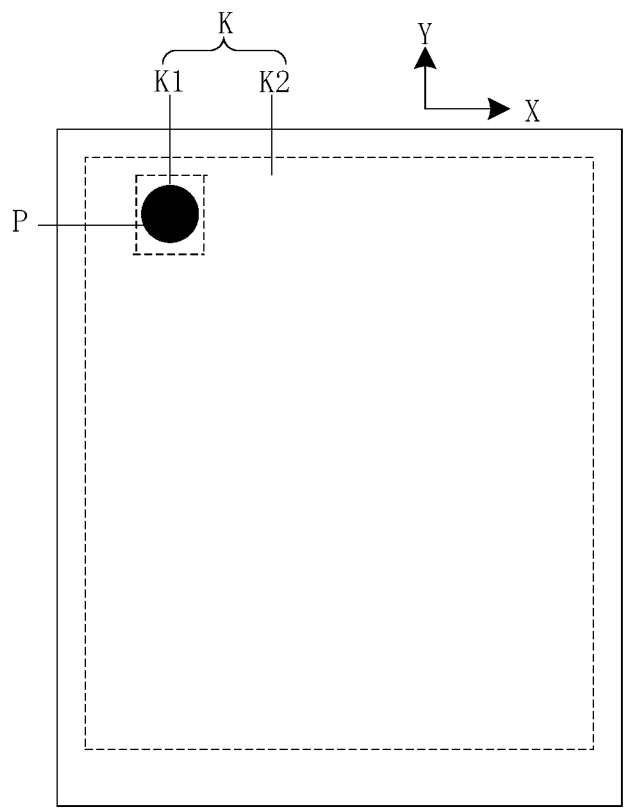
FIG. 5 illustrates a top view of another exemplary display panel consistent with various disclosed embodiments of the present disclosure.

In one embodiment, at least a portion of the stretchable display area K may extend to the side of the display panel so as to reduce the stretch damage to the boundary area between the stretchable display area K and other display areas. As shown in FIG. 1, a portion of the stretchable display area K may extend to the side of the display panel. FIG. 5 illustrates a top view of another exemplary display panel consistent with various disclosed embodiments of the present disclosure. As shown in FIG. 5, in some embodiments, the entire stretchable display area K may extend to the side of the display panel. In particular, the display area of the display panel may all be the stretchable display area K.

Further, at least a portion of the second stretchable display area K2 may be located between the first stretchable display area K1 and the side of the display panel to reduce stretch damage on the boundary area between the first stretchable display area K1 and the side of the display panel. As shown in FIG. 1, a portion of the second stretchable display area K2 may be located between the first stretchable display area K1 and the side of the display panel, and a portion of the second stretchable display area K2 may be located between the first stretchable display area K1 and other display areas. In some embodiments, as shown in FIG. 5, the entire second stretchable display areas K2 may be located between the first stretchable display area K1 and the side of the display panel.

Figure 6:
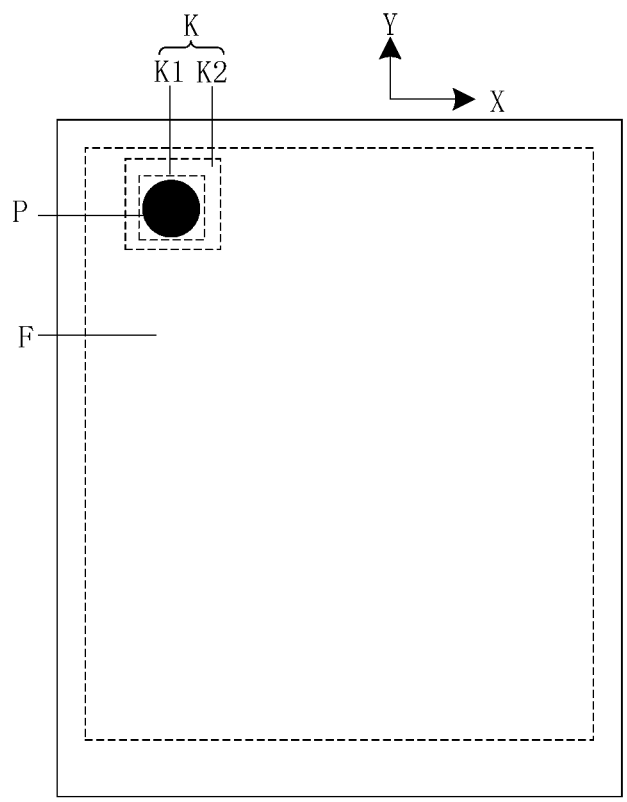
FIG. 6 illustrates a top view of another exemplary display panel consistent with various disclosed embodiments of the present disclosure.

FIG. 6 is a schematic top view of another exemplary display panel consistent with various disclosed embodiments of the present disclosure. As shown in FIG. 6, the stretchable display area K may not extend the side of the display panel at all. In particular, the entire stretchable display area K may be located between other display areas and the side of the display panel. The second stretchable display area K2 may not be located between the first stretchable display area K1 and the side of the display panel. In particular, the second stretchable display area K2 may be entirely located between the first stretchable display area K1 and other display areas.

Figure 7:
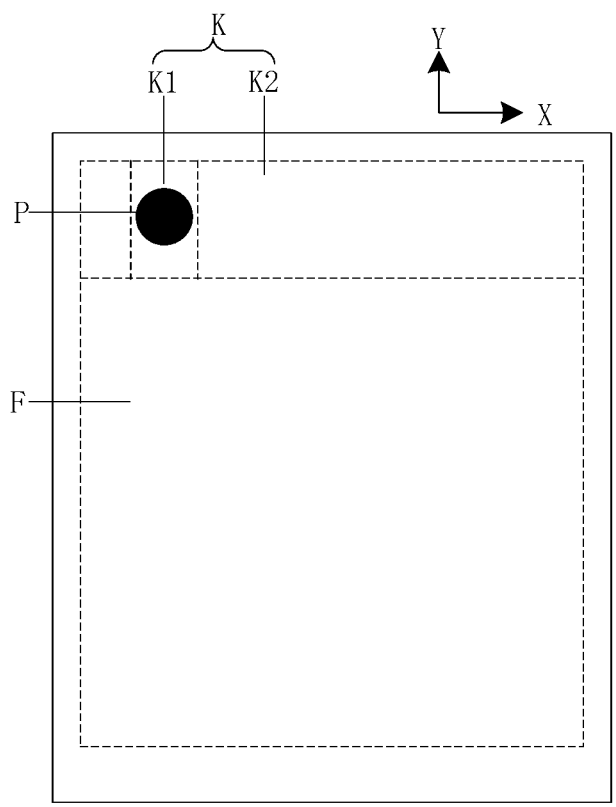
FIG. 7 illustrates a top view of another exemplary display panel consistent with various disclosed embodiments of the present disclosure.

In the present disclosure, as shown in FIG. 5, the display area of the display panel may all be stretchable display areas K. As shown in FIG. 1 and FIG. 6, the display area of the display panel may further include a non-stretchable display area F. The substrate of the non-stretchable display area F may be integral and inseparable. In particular, all display areas except the stretchable display area K may be the non-stretchable display area F, and the non-stretchable display area F may be adjoined to the stretchable display area K. The non-stretchable display area F and the stretchable display area K may be connected by the stretchable bridges 11. Further, at least a portion of the second stretchable display area K2 may be located between the non-stretchable display area F and the first stretchable display area K1 to reduce the stretch damage on the boundary area between the non-stretchable display area F and the first stretchable display area K1. As shown in FIG. 1, a portion of the second stretchable display area K2 may be located between the non-stretchable display area F and the first stretchable display area K1. In some embodiments, as shown in FIG. 6, the entire second stretchable display area K2 may be located between the non-stretchable display area F and the first stretchable display area K1. In particular, the second stretchable display area K2 may surround the first stretchable display area K1; and the non-stretchable display area F may surround the second stretchable display area K1. FIG. 7 is a schematic top view of another exemplary display panel consistent with various disclosed embodiments of the present disclosure. In other embodiments, as shown in FIG. 7, the entire second stretchable display area K2 may not be located between the non-stretchable display area F and the first stretchable display area K1.

Figure 8:
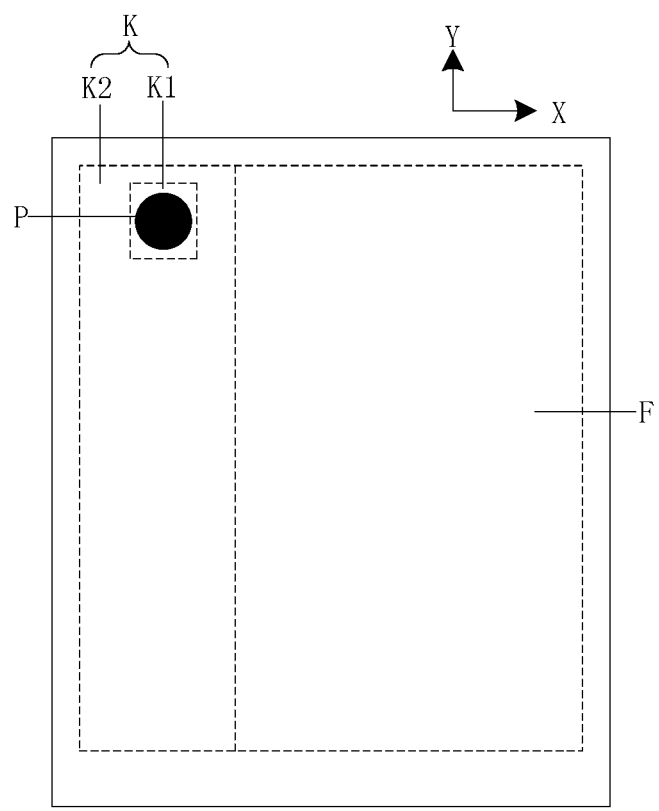
FIG. 8 illustrates a top view of another exemplary display panel consistent with various disclosed embodiments of the present disclosure.

In one embodiment of the present disclosure, as shown in FIG. 1, the stretchable display area K and the non-stretchable display area F may be arranged sequentially along a second direction Y. FIG. 8 illustrates another exemplary display panel consistent with various disclosed embodiments of the present disclosure. As shown in FIG. 8, in another embodiment, the stretchable display area K and the non-stretched display area F may be sequentially arranged along the first direction X to reduce the area of the boundary region between the stretchable display area K and the non-stretchable display area F, and to reduce the stretch damage on the boundary region between the stretchable display area K and the non-stretchable display area F. Further, the overall stretchable degree of the stretchable display area K may be increased. Accordingly, the stretchable degree and the light transmittance of the first stretchable display area K1 may be increased.

In one embodiment of the present disclosure, as shown in FIG. 2, a number of island-shaped structures 10 and a number of stretchable bridges 11 may enclose an opening (e.g., having an open area that the light can transmit in/out the display panel). The degree of the stretch deformation of an opening Z1 (e.g., having an enclosed area within the dotted frame illustrated in FIG. 2) in the first stretchable display area K1 may be greater than that of an opening Z2 in the second stretchable display area K2. In particular, the amount of the deformation of the opening Z1 before and after stretching may be greater than the amount of the deformation of the opening Z2 before and after stretching. Or, the area change of the opening Z1 before and after stretching may be greater than the area change of the opening Z2 before and after stretching. Accordingly, the stretchable degree of the first stretchable display area K1 may be greater than the stretchable degree of the second stretchable display area K2. Under such a configuration, outside light may enter the under-screen camera P under the screen of the display panel through the openings.

It should be noted that, in the present disclosure, a number of island-shaped structures 10 and a number of stretchable bridges 11 may enclose an opening, and the length of the shortest side of an opening Z1 in the first stretchable display area K1 may greater than 100 um to avoid the light diffraction caused by a too small area of the opening Z1. The light diffraction may affect the shooting effect of the under-screen camera P.

In one embodiment of the present disclosure, the stretch deformation of the stretchable bridges 11 in the first stretchable display area K1 may be greater than the stretch deformation of the stretchable bridges 11 in the second stretchable display area K2 such that the first stretchable display area K1 may be more stretchable than the second stretchable display area K2. In particular, the amount of the length change of the stretchable bridge 11 in the first stretchable display area K1 before and after stretching may be greater than the amount of the length change of the stretchable bridge 11 in the second stretchable display area K2 before and after stretching. It should be noted that the length of the stretchable bridge 11 in the present disclosure may be not less than the distance between adjacent island-shaped structures 10, and the longer the length of the stretchable bridge is, the greater the stretch deformation of the stretchable display area is.

In one embodiment, the shape of the stretchable bridge 11 in the first stretchable display area K1 may be different from the shape of the stretchable bridge 11 in the second stretchable display area K2. The shape difference may include a length difference, a width difference, and/or a height difference. For example, the width of the stretchable bridge 11 in the first stretchable display area K1 may be smaller than the width of the stretchable bridge 11 in the second stretchable display area K2. The height of the stretchable bridge 11 in the first stretchable display area K1 may be smaller than the height of the stretchable bridge 11 in the second stretchable display area K2. The length of the stretchable bridge 11 in the first stretchable display area K1 may be greater than the length of the stretchable bridge 11 in the second stretchable display area K2. Thus, the amount of the stretch deformation of the stretchable bridge 11 in the first stretchable display area K1 may be greater than the amount of stretch deformation of the stretchable bridge 11 in the second stretchable display area K2.

Further, the number of film layers of the stretchable bridge 11 in the first stretchable display area K1 may be different from the number of film layers of the stretchable bridge 11 in the second stretchable display area K2 such that the thickness of the stretchable bridge 11 in the first stretchable display area K1 may be smaller than the thickness of the stretchable bridge 11 in the second stretchable display area K2. Thus, the stretched amount of the stretchable bridge 11 in the first stretchable display area K1 may be greater than the stretched amount of the stretchable bridge 11 in the second stretchable display area K2.

Further, the material of the stretchable bridge 11 in the first stretchable display area K1 may be different from the material of the stretchable bridge 11 in the second stretchable display area K2 such that the elastic modulus of the first stretchable bridge 11 in the first stretchable display area K1 may be smaller than that of the stretchable bridge 11 in the second stretchable display area K2. Thus, the stretched amount of the stretchable bridge 11 in the first stretchable display area K1 may be greater than the stretched amount of the stretchable bridge 11 in the second stretchable display area K2.

In one embodiment of the present disclosure, as shown in FIG. 2, the island-shaped structures 10 in the first stretchable display area K1 may be strip island-shaped structures extending along a row direction, i.e., the first direction X, and arranged along the column direction, i.e., the second direction Y. Further, the length of the island-shaped structure 10 in the first stretchable display area K1 along the first direction X may be greater than the length of the island-shaped structure 10 in the second stretchable display area K2 along the first direction X such that the stretchable degree of the first stretchable display area K1 may be greater than that of the second stretchable display area K2, and the area of the opening Z1 in the first stretchable display area K1 after stretching may be increased. Thus, the light diffraction caused by a too small size of the opening Z1 in the first stretchable display area K1 may be avoided.

Because the length of the island-shaped structure 10 in the first stretchable display area K1 along the first direction X may be greater than that of the island-shaped structure 10 in the second stretchable display area K2 along the first direction X, when the length of the island-shaped structure 10 along the first direction X in the first stretchable display area K1 is assumed to be 2, and the length of the island-shaped structure 10 along the first direction X in the second stretchable display area K2 is assumed to be 1, and before stretching, the length of the opening Z1 may be assumed to be 2, the width may be assumed to be 1, the length of the opening Z2 may be assumed to be 1, the width may be assumed to be 1, the length of the stretchable bridge 11 may be assumed to be 1, and after stretching, the length of the stretchable bridge 11 may be assumed to be 2. Thus, the area change of the first opening Z1 before and after stretching may be $(1+2+1) \times (1+1) - 1 \times 2 = 6$, and the area change of the opening Z2 may be $(1+1+1) \times (1+1) - 1 \times 1 = 5$. In particular, by making the length of the island-shaped structure 10 in the first stretchable display area K1 along the first direction X to be greater than the length of the island-shaped structure 10 in the second stretchable display area K2 along the first direction X, the amount of the area change of the opening Z1 before and after stretching may be greater than the amount of the area change of the opening Z2 before and after stretching. Accordingly, the stretchable degree of the first stretchable display area K1 may be greater than that of the second stretchable display area K2.

It should be noted that, in one embodiment, the length of the island-shaped structure 10 in the first stretchable display area K1 along the second direction Y may be equal to the length of the island-shaped structure 10 in the second stretchable display area K2 along the second direction Y. In another embodiments, the length of the island-shaped structure 10 in the first stretchable display area K1 along the second direction Y may be not equal to the length of the island-shaped structure 10 in the second stretchable display area K2 along the second direction Y. The length relationship between the island-shaped structures is not limited in present disclosure, as long as the stretchable degree of the first stretchable display area K1 may be greater than that of the second stretchable display area K2, and the area of the opening Z1 in the first stretchable display area K1 after stretching may not cause the light diffraction phenomenon.

Further, it should also be noted that, in one embodiment, the first direction in FIG. 2 is the X direction, and the second direction is the Y direction. In some embodiments, the first direction may also be the Y direction; and the second direction may also be the X direction.

Figure 9:
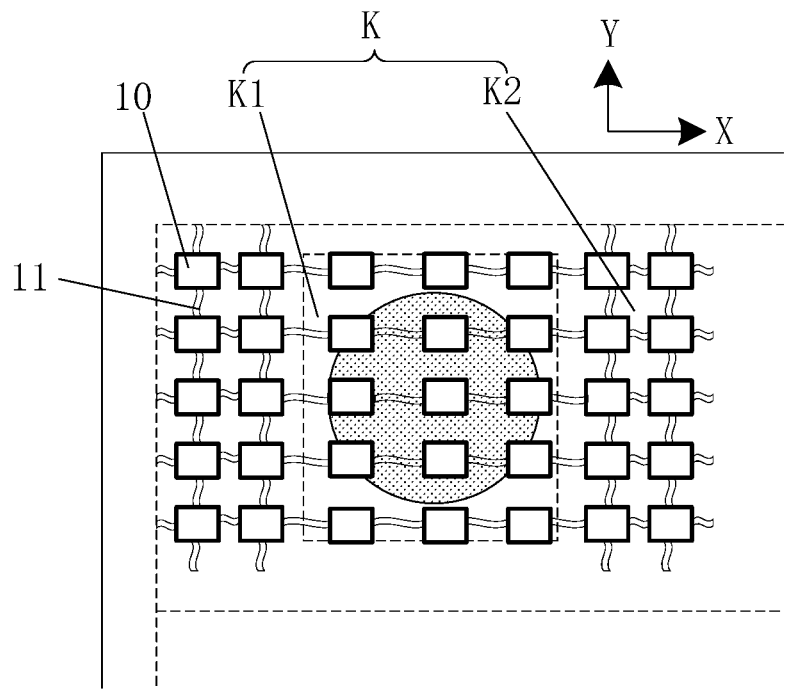
FIG. 9 illustrates a portion of another exemplary stretchable display area K consistent with various disclosed embodiments of the present disclosure.

FIG. 9 is a schematic diagram of a portion of another exemplary stretchable display area K consistent with various disclosed embodiments of the present disclosure. As shown in FIG. 9, in another embodiment, the length of the island-shaped structure 10 in the first stretchable display area K1 along the first direction X may be equal to the length of the island-shaped structure 10 in the second stretchable display area K2 along the first direction X, and the length of the island-shaped structure 10 in the first stretchable display area K1 along the second direction Y may also be equal to the length of the island-shaped structure 10 in the second stretchable display area K2 along the second direction Y. Under such a configuration, by causing the stretched amount of the stretchable bridge 11 in the first stretchable display area K1 to be greater than the stretched amount of the stretchable bridge 11 in the second stretchable display area K2, the stretchable degree of the first stretchable display area K1 may be greater than that of the second stretchable display area K2.

In some embodiments of the present disclosure, when the length of the island-shaped structure 10 in the first stretchable display area K1 along the first direction X is not equal to the length of the island-shaped structure 10 in the second stretchable display area K2 along the first direction X, and the length of the island-shaped structure 10 in the first stretchable display area K1 along the second direction Y is not equal to the length of the island-shaped structure 10 in the second stretchable display area K2 along the second direction Y, the stretchable degree of the first stretchable display area K1 may be made to be greater than the stretchable degree of the second stretchable display area K2 by causing the length of the stretch deformation of the stretchable bridge 11 in the first stretchable display area K1 to be greater than that of the stretchable bridge 11 in the second stretchable display area K2.

Figure 10:
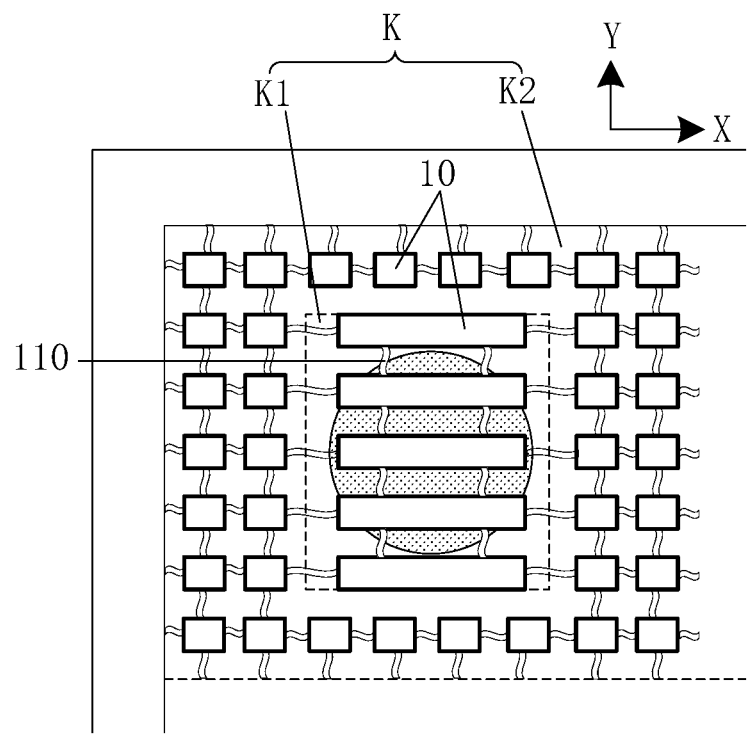
FIG. 10 illustrates a portion of another exemplary stretchable display area K consistent with various disclosed embodiments of the present disclosure.

FIG. 10 is a schematic diagram of a portion of an exemplary stretchable display area K consistent with various disclosed embodiments of the present disclosure. As shown in FIG. 10, in one embodiment, the stretchable bridges 11 may include a first stretchable bridge 110. The first stretchable bridge 110 may connect two adjacent island-shaped structures along the second direction Y. The second direction Y may intersect the first direction X. In one embodiment, the second direction Y may be perpendicular to the first direction X.

When the length of the island-shaped structure 10 in the first stretchable display area K1 along the first direction X is longer, in particular, the length of the island-shaped structure 10 in the first stretchable display area K1 along the first direction X is greater than a preset length, in the first stretchable display area K1, at least two adjacent island-shaped structures 10 may be connected by a plurality of first stretchable bridges 110 to improve the stretch stability of the island-shaped structures 10 in the first stretchable display area K1. Under such a configuration, the length of the island-shaped structure 10 in the first stretchable display area K1 along the first direction X may be greater than the length of the island-shaped structure 10 in the second stretchable display area K2 along the first direction X. The length of the island-shaped structure 10 in the first stretchable display area K1 along the first direction X may also be equal to the length of the island-shaped structure 10 in the second stretchable display area K2 along the first direction X, as long as the length of the island-shaped structure 10 in the first stretchable display area K1 along the first direction X may be greater than the preset length. In particular, the opening Z1 enclosed by adjacent first stretchable bridges 110 and the island-shaped structures 10 may not have a light diffraction issue caused be a too small area of the opening Z1.

Further, in one embodiment of the present disclosure, the openings Z1 in the first stretchable display area K1 may be irregularly arranged to reduce the diffraction of light at the openings Z1, and improve the clarity of the image captured by the under-screen camera P.

Figure 11:
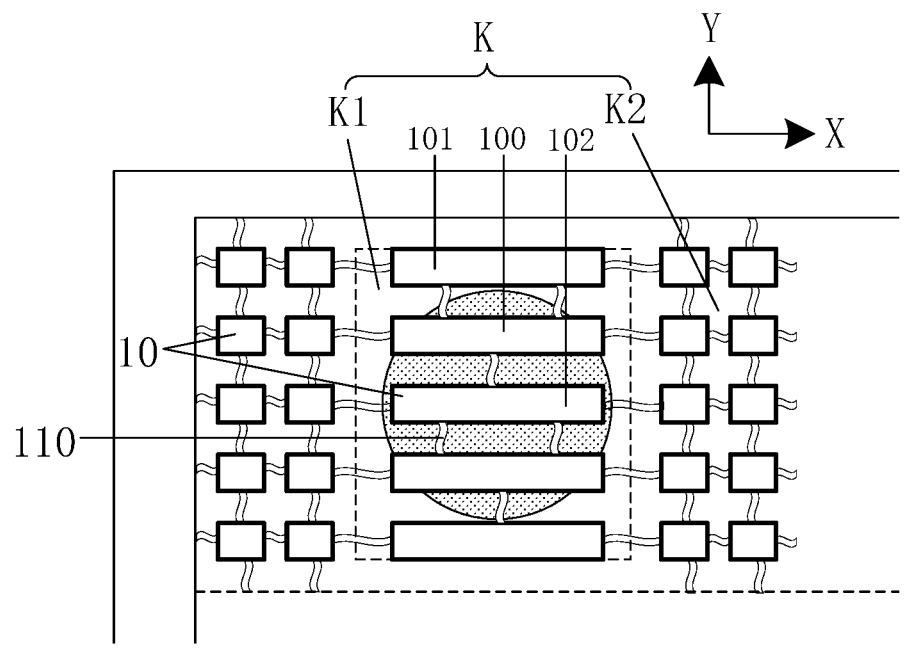
FIG. 11 illustrates a portion of another exemplary stretchable display area K consistent with various disclosed embodiments of the present disclosure.

FIG. 11 is a schematic diagram of a portion of another exemplary stretchable display area K consistent with various disclosed embodiments of the present disclosure. As shown in FIG. 11, in the first stretchable display area K1, at least one island-shaped structure 10 and two adjacent island-shaped structures 10 may be connected by different numbers of first stretchable bridges 110. For example, the number of first stretchable bridges 110 between the island-shaped structure 100 and the island-shaped structure 101 and the number of the first stretchable bridges 110 between the island-shaped structure 100 and the island-shaped structure 102 may be different such that the areas of the openings Z1 in the first stretchable display area K1 may be unequal, and may be arranged irregularly to reduce the diffraction phenomenon of light at the openings Z1.

Thus, in one embodiment of the present disclosure, in the first stretchable display area K1, a plurality of island-shaped structures 10 may be arranged in an array along the first direction X and the second direction Y, a first gap extending along the first direction X may be located between adjacent rows of island-shaped structures 10; and a second gap extending along the second direction Y may be located between two adjacent columns of island-shaped structures 10. The number of stretchable bridges 11 in at least two first gaps may be different, and/or the number of the stretchable bridges 11 in at least two second gaps may be different such that the openings Z1 in the first stretchable display area K1 may be irregularly arranged to reduce the light diffraction phenomenon at the openings Z1.

Figure 12:
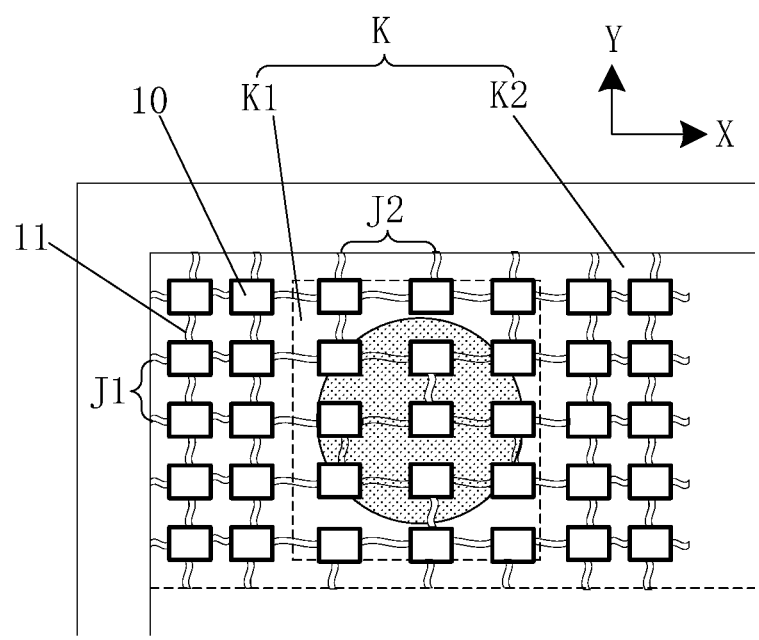
FIG. 12 illustrates a portion of another exemplary stretchable display area K consistent with various disclosed embodiments of the present disclosure.
Figure 13:
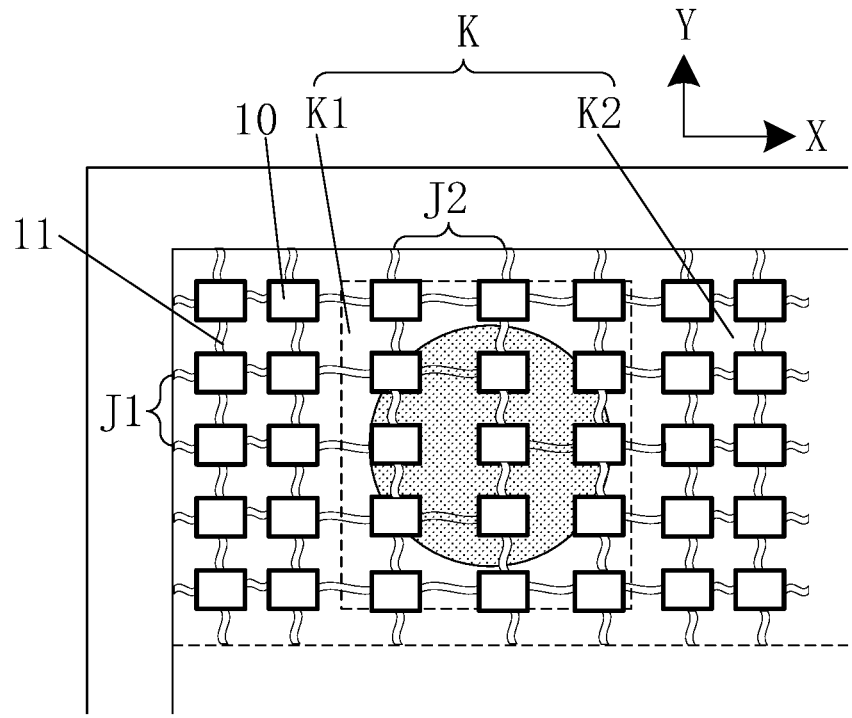
FIG. 13 illustrates a portion of another exemplary stretchable display area K consistent with various disclosed embodiments of the present disclosure.

FIG. 12 illustrates a portion of another exemplary stretchable display area K consistent with various disclosed embodiments of the present disclosure. As shown in FIG. 12, the number of stretchable bridges 11 in two adjacent first gaps J1 may be different. FIG. 13 illustrates a portion of another exemplary stretchable display area K consistent with various disclosed embodiments of the present disclosure. As shown in FIG. 13, the number of stretchable bridges 11 in two adjacent second gaps J2 may be different.

It should be noted that, in FIG. 12 and FIG. 13, for illustrative purposes, the island-shaped structures 10 in the first stretchable display area K1 and the island-shaped structures 10 in the second stretchable display area K2 may have the same shape and size. However, the shapes and the sizes of the island-shaped structures are not limited by the present disclosure. Further, in FIG. 12 and FIG. 13, that two adjacent island-shaped structures 10 are connected by a stretchable bridge 11 is used as an example for illustration. In some embodiments, as shown in FIG. 11, the two adjacent island-shaped structures 10 may also be connected by a plurality of stretchable bridges 11.

In another embodiment of the present disclosure, the irregular arrangement of the openings Z1 may also be realized by the staggered arrangement of the stretchable bridges 11. In particular, the plurality of island-shaped structures 10 in the first stretchable display area K1 may be arranged an array along the first direction X and the second direction Y. Further, the adjacent rows of island-shaped structures 10 may have a first gap extending along the first direction X, and the adjacent columns of island-shaped structures 10 may have a second gap extending along second direction Y. The stretchable bridges 11 in the at least two first gaps may have a staggered arrangement along the second direction Y (for example, may not be aligned along the second direction Y), and/or, the stretchable bridges 11 in at least two second gaps may have a staggered arrangement along the first direction X (for example, may not be aligned along the first direction X), such that the openings Z1 in the first stretchable display area K1 may be irregularly arranged to reduce the diffraction phenomenon of light at the openings Z1.

Figure 14:
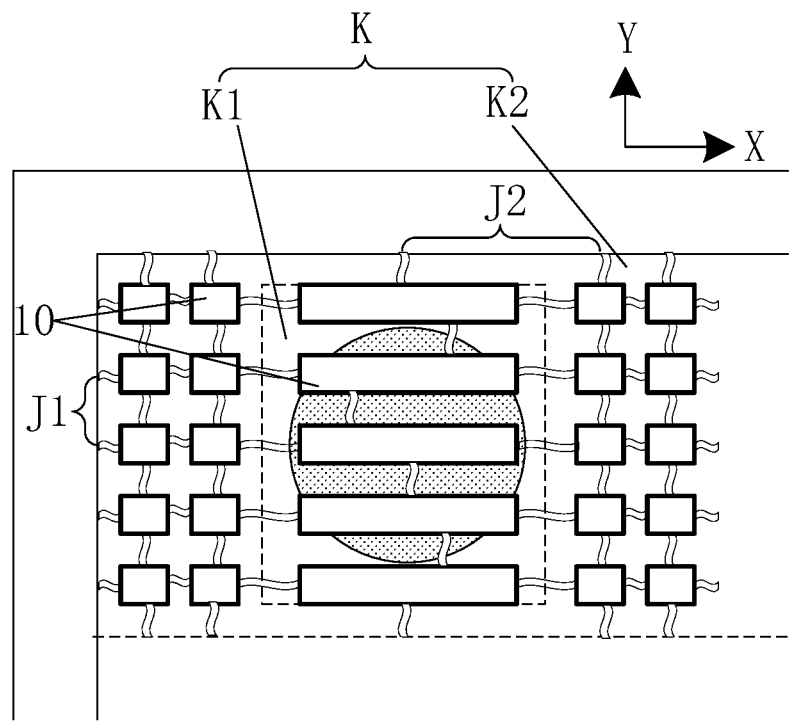
FIG. 14 illustrates a portion of another exemplary stretchable display area K consistent with various disclosed embodiments of the present disclosure.
Figure 15:
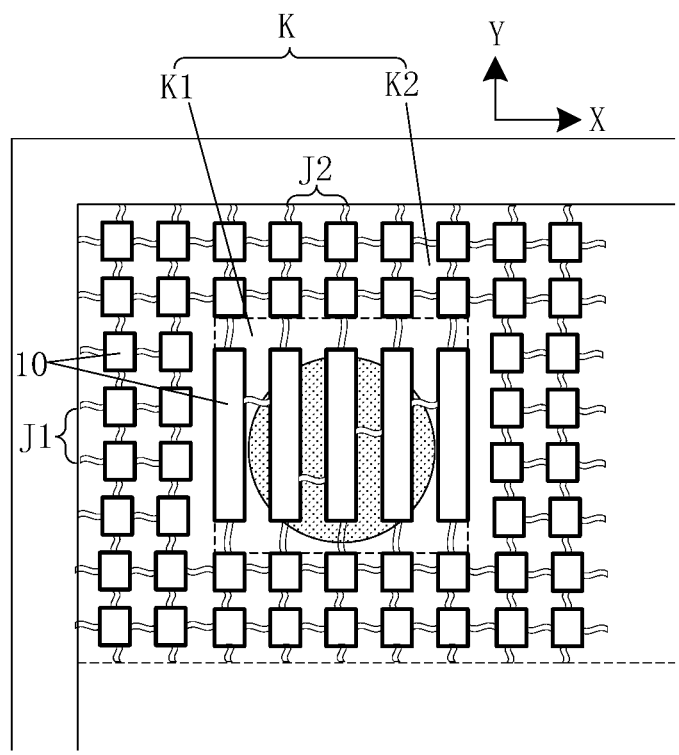
FIG. 15 illustrates a portion of another exemplary stretchable display area K consistent with various disclosed embodiments of the present disclosure.

FIG. 14 illustrates a portion of another exemplary stretchable display area K consistent with various disclosed embodiments of the present disclosure. As shown in FIG. 14, the stretchable bridges 11 in at least two first gaps J1 may have the staggered arrangement along the second direction Y. FIG. 15 illustrates a portion of another exemplary stretchable display area K consistent with various disclosed embodiments of the present disclosure. As shown in FIG. 15, the stretchable bridges 11 in at least two second gaps J2 may have a staggered arrangement along the first direction X.

It should be noted that, in one embodiment of the present disclosure, the island-shaped structures 10 in the second stretchable display area K2 may be arranged as a uniform array, and adjacent island-shaped structures 10 may be connected to each other by stretchable bridges 11 such that the second stretchable display area K2 may form a uniform grid, and the second stretchable display area K2 may be evenly stressed. Accordingly, the structure of the second stretchable display area K2 under the stretched state may be stable without a distortion such that it may provide an uniform tension to the first stretchable display area K1.

In one embodiment, as shown in FIG. 14, the plurality of island-shaped structures 10 in the second stretchable display area K2 may be arranged as an array along the first direction X and the second direction Y. The first direction X may intersect the second direction Y. The two adjacent island-shaped structures 10 along the first direction X may be connected to each other by a stretchable bridge 11, and the two adjacent island-shaped structures 10 along the second direction Y may be connected to each other by stretchable bridge 11. In particular, in the second stretchable display area K2, any two adjacent island-shaped structures 10 may be connected to each other through the stretchable bridge 11 such that the stretch of the second stretchable display area K2 may be more controllable and more stable.

In one embodiment of the present disclosure, in the first stretchable display area K1, any two adjacent island-shaped structures 10 may be connected to each other through a stretchable bridge 11 such that the first stretchable display area K1 may have a higher stretch stability. In some embodiments, a portion of the island-shaped structures 10 and other adjacent island-shaped structure 10 may not be connected. In particular, in the first stretchable display area K1, at least a portion of the island-shaped structures 10 and the adjacent island-shaped structures 10 may not be connected such that the first stretchable display area K1 may be more stretchable than the second stretchable display area K2 and the area of a portion of the openings Z1 in the first stretchable display area K1 may be increased. Accordingly, the light transmittance of the region of the under-screen camera P may be increased. Under such a configuration, the at least portion of the island-shaped structures 10 may be located in the first stretchable display area K1, and the adjacent island-shaped structures 10 may be located in the first stretchable display area K1, or may be located in the second stretchable display area K2.

It should be noted that, in one embodiment of the present disclosure, when any two adjacent island-shaped structures 10 in the first stretchable display area K1 are connected to each other through a stretchable bridge 11, by causing any two adjacent island-shaped structures 10 in the second stretchable display area K2 to be connected to each other by a stretchable bridge 11, the second stretchable display area K2 may uniformly transfer the tensile stress in the first stretchable display area K1 out such that the tensile stress received by each area of the first stretchable display area K1 may be evenly distributed; and the stretch deformation of the first stretchable display area K1 may be a stable and uniform deformation.

When a portion of the island-shaped structures 10 in the first stretchable display area K1 and the adjacent island-shaped structures 10 are not connected, by making any two adjacent island-shaped structures 10 in the second stretchable display area K2 to be connected to each other through the stretchable bridge 11, the second stretchable display area K2 may maintain its own stability and uniformity. The unevenness of the second stretchable display area K2 itself may not be applied to the first stretchable display area K1 to affect the deformation of the first stretchable display area K1. In particular, the deformation of the first stretchable display area K1 may not deviate from the original deformation.

Figure 16:
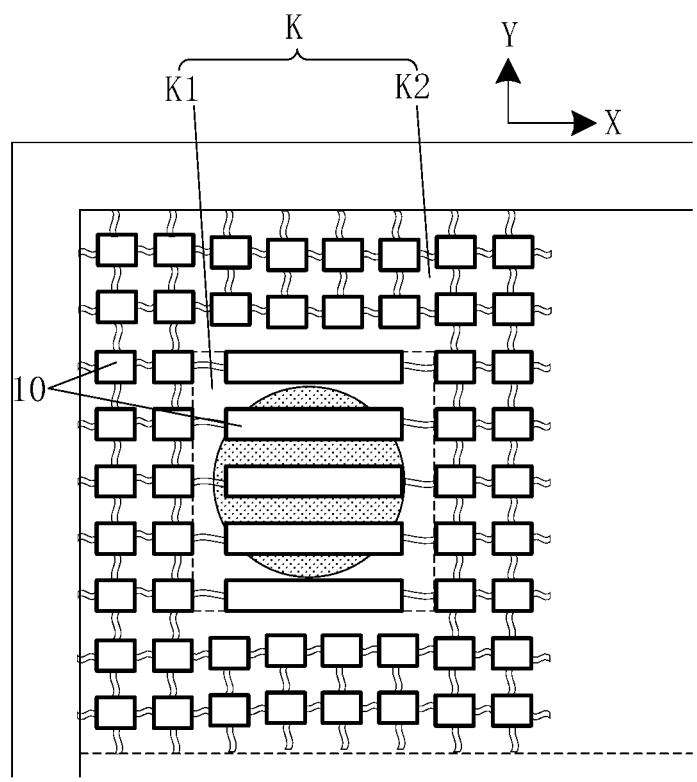
FIG. 16 illustrates a portion of another exemplary stretchable display area K consistent with various disclosed embodiments of the present disclosure.

FIG. 16 is a schematic diagram of a portion of another exemplary stretchable display area K consistent with various disclosed embodiments of the present disclosure. As shown in FIG. 16, in the first stretchable display area K1, a plurality of island-shaped structures 10 may be arranged as an array along the first direction X and the second direction Y. The first direction X may intersect the second direction Y. Two adjacent island-shaped structures 10 along the first direction X may be connected to each other through the stretchable bridge 11, and the two adjacent island-shaped structures 10 along the second direction Y may not be connected such that the stretchable degree of the first stretchable display area K1 may be greater than that of the second stretchable display area K2. Further, the area of a portion of the openings Z1 in the first stretchable display area K1 may be increased; and the light transmittance of the region of the under-screen camera P may be further increased. Similarly, in FIG. 16, the first direction is the X direction, and the second direction is the Y direction. In some embodiments, the first direction may also be the Y direction, and the second direction may also be X direction.

Figure 17:
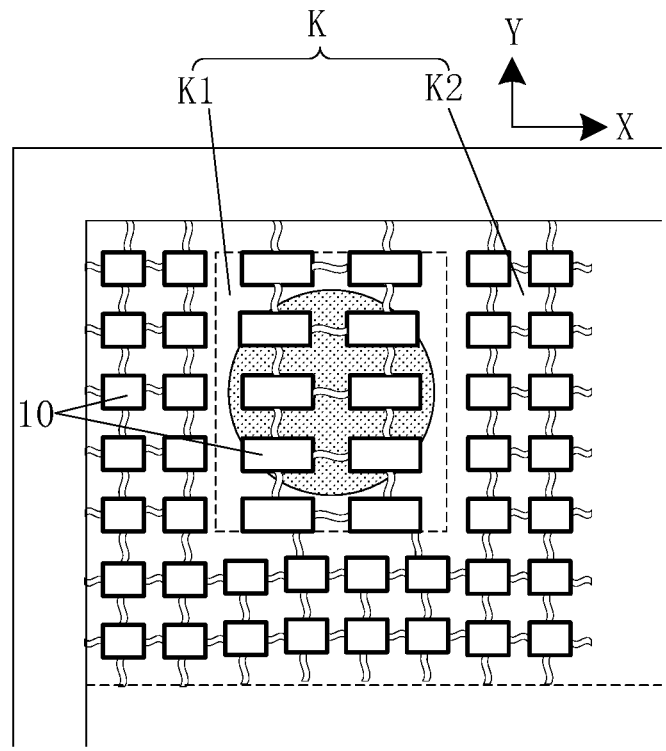
FIG. 17 illustrates a portion of another exemplary stretchable display area K consistent with various disclosed embodiments of the present disclosure.

FIG. 17 is a schematic diagram of a portion of another stretchable display area K consistent with various disclosed embodiments of the present disclosure. As shown in FIG. 17, in some embodiments, in the first stretchable display area K1, a plurality of island-shaped structures 10 may be arranged as an array along the first direction X and the second direction Y. The first direction X may intersect the second direction Y. The adjacent island-shaped structures 10 along the second direction Y may be connected to each other through the stretchable bridge 11. The adjacent island-shaped structures 10 along the first direction X may be connected to each other by a stretchable bridge 11. Among the island-shaped structures 10 adjacent to the second stretchable display area K2, at least a portion of the island-shaped structures 10 may not be connected to the island-shaped structures 10 in the second stretchable display area K2 and adjacent to the at least portion of the island-shaped structures 10. For example, the island-shaped structure 10 in the first stretchable display area K1 may not be connected to the island-shaped structure 10 in the second stretchable area K2 at the left side of the first stretchable display area K1 and adjacent to the island-shaped structure 10 in the first stretchable display area K1, and the island-shaped structure 10 in the first stretchable display area K1 may not be connected to the island-shaped structure 10 in the second stretchable display area at the right of the first stretchable display area K1 and adjacent to the island-shaped structure 10 in the first stretchable area K1 such that the first stretchable display area K1 may be more stretchable than the second stretchable display area K2. Accordingly, the area of a portion of the openings Z1 in the first stretchable display area K1 may be further increased, and the light transmittance of the region of the under-screen camera P may be further increased.

It should be noted that, in one embodiment, there may be a second stretchable display area K2 between the island-shaped structure 10 in the first stretchable display area K1 and the non-stretchable display area F, and the island-shaped structure 10 in the first stretchable display area K1 may be connected to the island-shaped structure 10 in the second stretchable display area K2 between the first stretchable display area K1 and the non-stretched display area F to reduce the stretch damage on the boundary region between the first stretchable display area K1 and the non-stretchable display area F.

Figure 18:
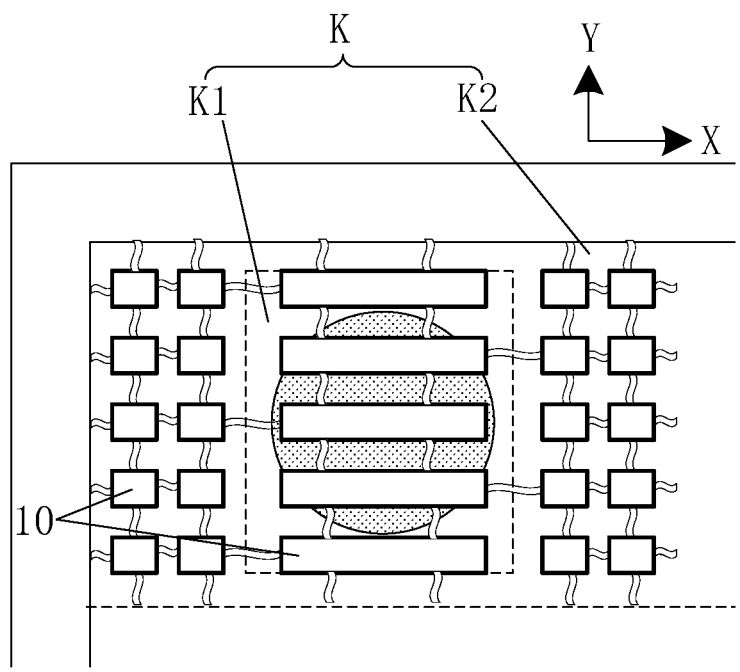
FIG. 18 illustrates a portion of another exemplary stretchable display area K under a non-stretched state consistent with various disclosed embodiments of the present disclosure.
Figure 19:
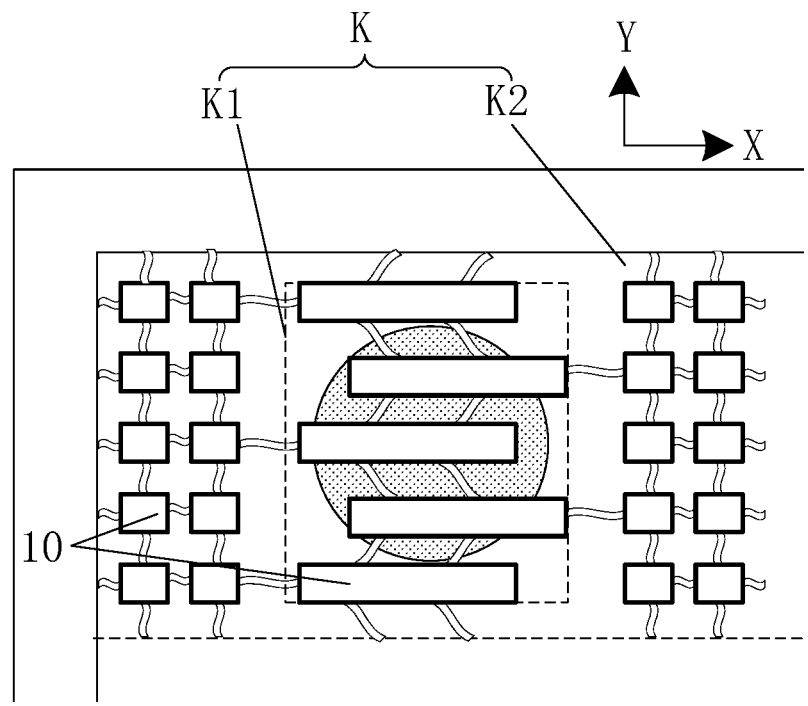
FIG. 19 illustrates a portion of another exemplary stretchable display area K under a stretched state consistent with various disclosed embodiments of the present disclosure.

FIG. 18 illustrates a portion of another exemplary stretchable display area K under a non-stretched state consistent with various disclosed embodiments of the present disclosure; and FIG. 19 illustrates a portion of another exemplary stretchable display area K under a stretched state consistent with various disclosed embodiments of the present disclosure. As shown in FIGS. 18-19, in the first stretchable display area K1, a plurality of island-shaped structures 10 may be arranged as an array along a first direction X and a second direction Y. The first direction X may intersect the second direction Y. Further, the second stretchable display area K2 may be located at both sides of the first stretchable display area K1 along the first direction X, respectively.

Taking the first direction X as the row direction as an example, in the first stretchable display area K1, at least one row of the island-shaped structures 10 may be connected to the island-shaped structures 10 in the second stretchable display area K2 at one side of the first stretchable display area K1 and adjacent thereto by the stretchable bridge 11, and may not be connected to the island-shaped structures 10 in the second stretchable display area K2 at the other side of the first stretchable display area K1 and adjacent thereto. At least another row of island-shaped structures 10 may be connected to the island-shaped structures 10 in the second stretchable display area K2 at the other side of the first stretchable display area K1 and adjacent thereto by a stretchable bridge 11, and may not be connected to the island-shaped structures 10 in the second stretchable display area K2 at the side of the first stretchable area K1 and adjacent thereto. For example, the first row of island-shaped structures 10 may be connected to the island-shaped structures 10 in the second stretchable display area K2 at the left side of the first stretchable display area K1 and adjacent to the first row of island-shaped structures 10 by a stretchable bridges 11, the first row of island-shaped structures 10 may not be connected to the island-shaped structures 10 in the second stretchable display area K2 at the right of the first stretchable display area K1 and adjacent to the first row of island-shaped structures 10. The second row of island-shaped structures 10 may be connected to the island-shaped structures 10 in the second stretchable display area K2 at the right of the first stretchable display area K1 and adjacent to the second row of island-shaped structures 10 by a stretchable bridge 11, and the second row of island-shaped structures 10 may not be connected to the island-shaped structures 10 in the second stretchable display area K2 at the left of the first stretchable display area K1 and adjacent to the second row of island-shaped structures 10. Such a configuration may be used to further increase the area of the first openings Z1 in the first stretchable display area K1 under the stretched state, and increase the light transmittance of the region of the under-screen camera P. Further, a plurality of island-shaped structure rows or a plurality rows of island-shaped structures 10 may be arranged with staggered patterns along the second direction Y such that the first openings Z1 in the first stretchable display area K1 may be irregularly arranged to reduce the light diffraction at the first openings Z1.

In one embodiment, the first stretchable display area K1 and the second stretchable display area K2 may be arranged along the first direction X. In some embodiments, the first stretchable display area K1 and the second stretchable display area K2 may be arranged along the second direction Y.

Further, in one embodiment of the present disclosure, because the second stretchable display area K2 may be located at both sides of the first stretchable display area K1 along the first direction X, it may provide uniform and stable tensile force to the first stretchable display area K1 from the opposing two sides, respectively. Secondly, the island-shaped structures 10 in different rows in the first stretchable display area K1 may receive the tensile stress provided by the second stretchable display area K2 from different sides. In particular, the island-shaped structures 10 in different rows may receive tensile stress from different directions. Further, the island-shaped structures 10 in the same row may only be stressed on one side, the opposing side may not be stressed. Thus, the opposing side may not produce a counter force. Accordingly, the degree of movement of the island-shaped structures 10 before and after stretching may be increased; and the deformation of the first openings Z1 before and after stretching may be increased. Further, the area of the first openings Z1 after stretching may be increased; and the light transmittance of the region of the under-screen camera P may be increased. Thirdly, the stretchable bridges 11 of the two island-shaped structure rows connected to the second stretchable display area K2 at both sides may not extend in a same row direction. In particular, under the stretched state, the openings formed by the stretchable bridges 11 and the island-shaped structure rows may not be regularly-shaped openings. Thus, the diffraction phenomenon of light at the openings Z1 may be further reduced.

Further, in FIGS. 18-19, under the non-stretched state, the stretchable bridge 11 between two adjacent rows of island-shaped structures 10 may extend along the second direction Y. However, the extending direction of the stretchable bridge is not limited in the present disclosure, and other implementations may also be used to further increase the degree of movement of the island-shaped structures 10 before and after stretching, and increase the deformation amount of the openings Z1 before and after stretching.

Figure 20:
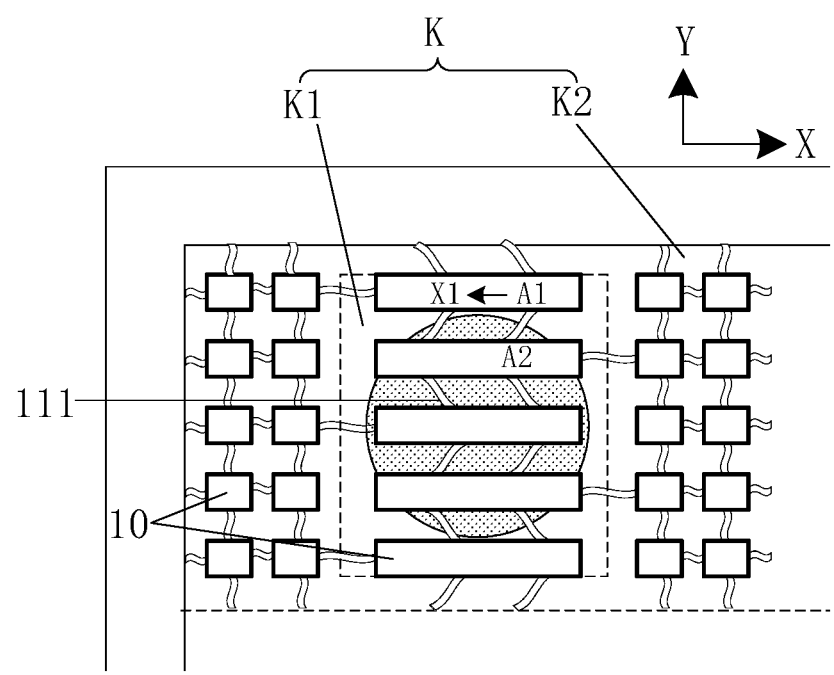
FIG. 20 illustrates a portion of another exemplary stretchable display area K under a non-stretched state consistent with various disclosed embodiments of the present disclosure.
Figure 21:
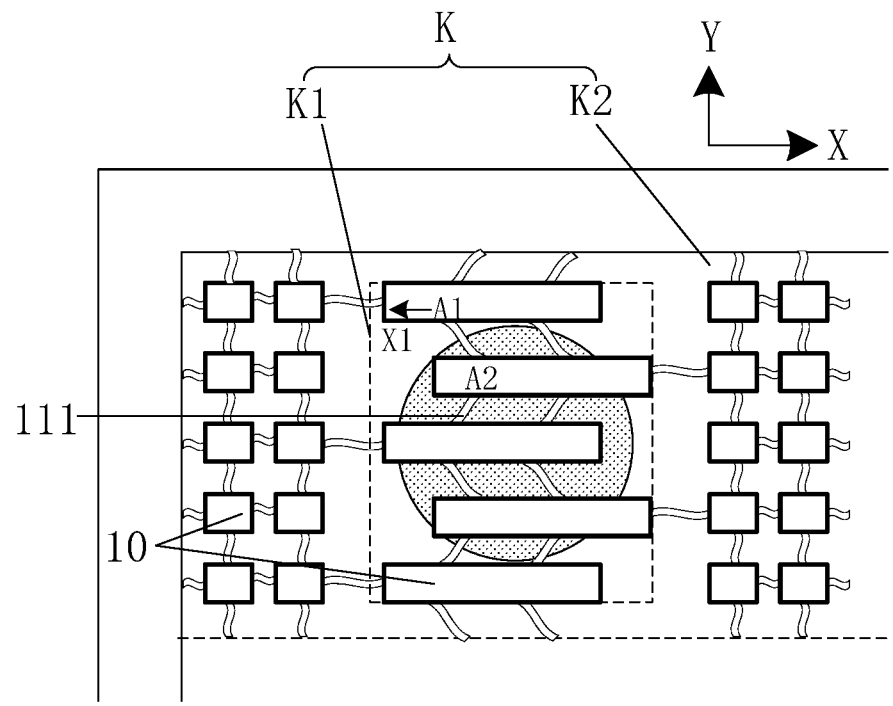
FIG. 21 illustrates a portion of another exemplary stretchable display area K under a stretched condition consistent with various disclosed embodiments of the present disclosure.

FIG. 20 is a schematic diagram of a portion of another exemplary stretchable display area K under a non-stretched state consistent with various disclosed embodiments. FIG. 21 is a schematic diagram of a portion of another exemplary stretchable display area K under a non-stretched state consistent with various disclosed embodiments. As shown in FIGS. 20-21, in some embodiments, under the non-stretched state and the stretched state, the stretchable bridges 11 between the two adjacent rows of island-shaped structures 10 may all be arranged obliquely, and the inclination directions of the stretchable bridges 11 under the stretched state may be different from the inclination directions of the stretchable bridge 11 under the non-stretched state.

As shown in FIG. 20, in the first stretchable display area K1, island-shaped' structures 10 in two adjacent island-shaped rows connecting the second stretchable display area K2 at different sides may be connected by a second stretchable bridge 111. For example, the first row of island-shaped structures 10 may be connected to the island-shaped structures 10 in the second stretchable display area K2 at the left of the first stretchable display area K1 and adjacent to the first row of island structures 10 by second stretchable bridges 111. The first row of island-shaped structures 10 may not be connected to the island-shaped structures 10 in the second stretchable display area K2 at the right of the first stretchable display area K1 and adjacent to the first row of island-shaped structures 10. The second row of island-shaped structures 10 may be connected to the island-shaped structures 10 in the second stretchable display area K2 at the right of the first stretchable display area K1 and adjacent to the second row of island-shaped structures 10 by a stretchable bridge 11. The second row of island-shaped structures 10 may not be connected to the island-shaped structures 10 in the second stretchable display area K2 at the left of the first stretchable display area K1 and adjacent to the second row of island-shaped structures 10.

The second stretchable bridge 111 may include a first end A1 and a second end A2 connected to two rows of island structures 10, respectively. The connecting line of the first end A1 and the second end A2 may intersect the second direction Y and the first direction X. For example, the end connected to the first row of island-shaped structures 10 may be the first end A1, and the end connected to the second row of island-shaped structures 10 may be the second end A2. Under the non-stretched state, as shown in FIG. 20, the direction of the first end A1 pointing to the second end A2 may have a component along the first direction X; and the component may be the third direction X1. In particular, the component of the direction of the first end A1 pointing to the second end A2 along the arrangement direction of the first stretchable display area K1 and the second stretchable display area K2 may be the third direction X1. Under the stretched state, as shown in FIG. 21, the component of the movement direction of the first end A1 relative to the second end A2 along the first direction X may be the same as the third direction X1. In particular, the component of the direction in which the first end A1 moves relative to the second end A2 along the arrangement direction of the first stretchable display area K1 and the second stretchable display area K2 may be same as the third direction X1.

It should be noted that, in one embodiment of the present disclosure, the first direction X may be same as the arrangement direction of the first stretchable display area K1 and the second stretchable display area K2. The direction of the first direction is not limited in the present disclosure. In some embodiments, the first direction X and the arrangement direction of the first stretchable display area K1 and the second stretchable display area K2 may also be different, as long as the component of the movement direction of the first end A1 relative to the second end A2 along the arrangement direction of the stretched display area K1 and the second stretchable display area K2 may be ensured to be same as the third direction X1 (the direction indicated by the arrow marked X1 in the FIGS. 20-21). The third direction X1 may be a component of the direction of the first end A1 pointing to the second end along the arrangement direction of the first stretchable display area K1 and the second stretchable display area K2.

In another word, the first stretchable display area K1 may include a first island-shaped structure row and a second island-shaped structure row, and the second stretchable display area K2 may include the second stretchable display area K2 at a first side, and the second stretchable display area K2 at a second side. The second stretchable display area K2 at the first side and the second stretchable display area K2 at the second side may be respectively located at two sides of the first stretchable display area K1 along the first direction X. The first island-shaped structure row may be connected to the second stretchable display area K2 at the first side, and the second island-shaped structure row may be connected to the second stretchable display area K2 at the second side. The first island-shaped structure row and the second island-shaped structure row may be connected by the second stretchable bridges 111. The second stretchable bridge 111 may include a first end A1 and a second end A2 connected to the first row of island structures and the second row of island structures, respectively. Under the non-stretched state, as shown in FIG. 20, the first end A1 may be located on a side of the second end A2 away from the second stretchable display area K2 at the first side. The second end A2 may be located at the side of the second end A2 adjacent to the second stretchable display area K2 at the second side. Under the stretched state, as shown in FIG. 21, the first end A1 may be located on the side of the second end A2 adjacent to the second stretchable display area K2 at the first side. The second end A2 may be located on the side of the first end A1 adjacent to the second stretchable display area K2 at the second side. It should be noted that the island-shaped structure row in one embodiment of the present disclosure may refer to a row of island-shaped structures.

Figure 22:
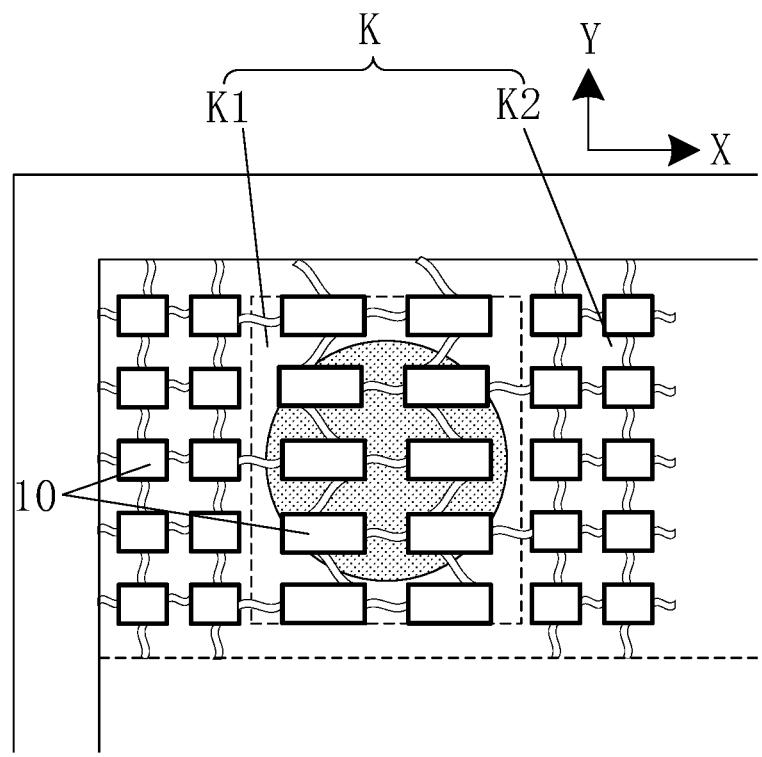
FIG. 22 illustrates a portion of another exemplary stretchable display area K consistent with various disclosed embodiments of the present disclosure.

It should be noted that, for illustrative purposes, in FIG. 20, one row of island-shaped structures 10 in the first stretchable display area K1 including one island-shaped structure 10 is used as an example. The number of the island-shaped structures is not limited by the present disclosure. FIG. 22 is a schematic diagram of a portion of another exemplary stretchable display area K consistent with various disclosed embodiments of the present disclosure. As shown in FIG. 22, in some embodiments, when a row of island-shaped structures 10 in the first stretchable display area K1 includes a plurality of island-shaped structures 10, the island-shaped structures 10 in the same row may be connected to each other through the stretchable bridges 11.

Figure 23:
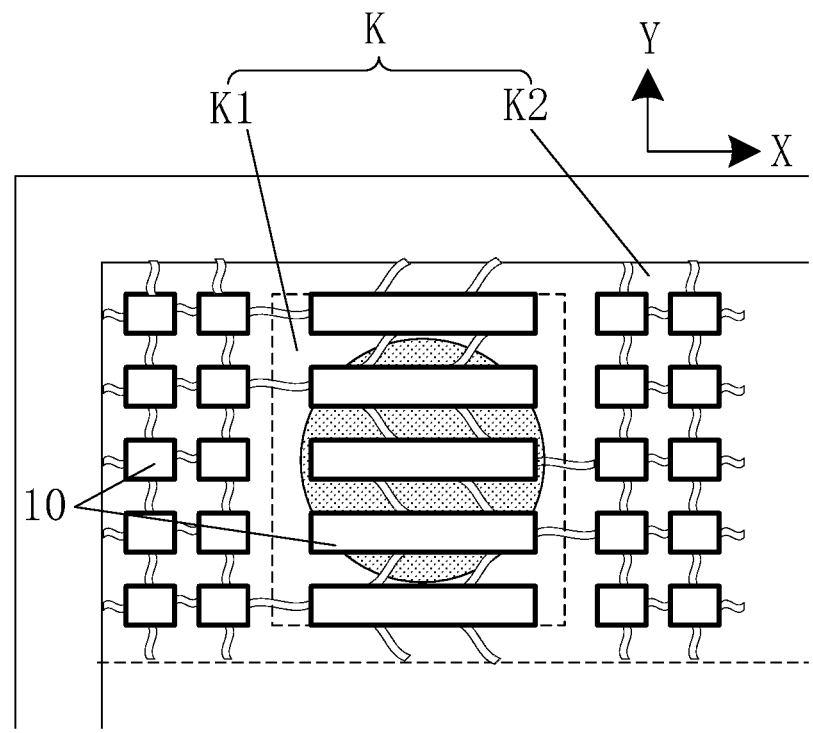
FIG. 23 illustrates a portion of another exemplary stretchable display area K consistent with various disclosed embodiments of the present disclosure.

FIG. 23 is a schematic diagram of a portion of another exemplary stretchable display area K consistent with various disclosed embodiments of the present disclosure. As shown in FIG. 23, in the first stretchable display area K1, at least two rows of island-shaped structures 10 form an island-shaped structure row group; and at least two adjacent island structure row groups may be respectively connected to the second stretchable display area K2 at different sides. As shown in FIG. 23, the first row of island-shaped structures 10 and the second row of island-shaped structures 10 may form an island-shaped structure row group. Further, the island-shaped structure row group may be connected to the second stretchable display area K2 at the left side of the first stretchable display area K1, and may not be connected to the second stretchable display area K2 at the right side of the first stretchable display area K1. The third row of island-shaped structures 10 and the fourth row of island-shaped structures 10 may form an island-shaped structure row group. The island-shaped structure row group may be connected to the second stretchable display area K2 at the right side of the display area K1, and may not be connected to the second stretchable display area K2 at the left side of the first stretchable display area K1. Such a configuration may further increase the area of the openings Z1 in the first stretchable display area K1, and further increase the light transmittance of the region of the under-screen camera P. Further, arranging the plurality of island-shaped structure rows along the second direction Y with a staggered pattern may allow the openings Z1 in the first stretchable display area in K1 to be irregularly arranged to reduce the diffraction of light at the openings Z1.

Figure 24:
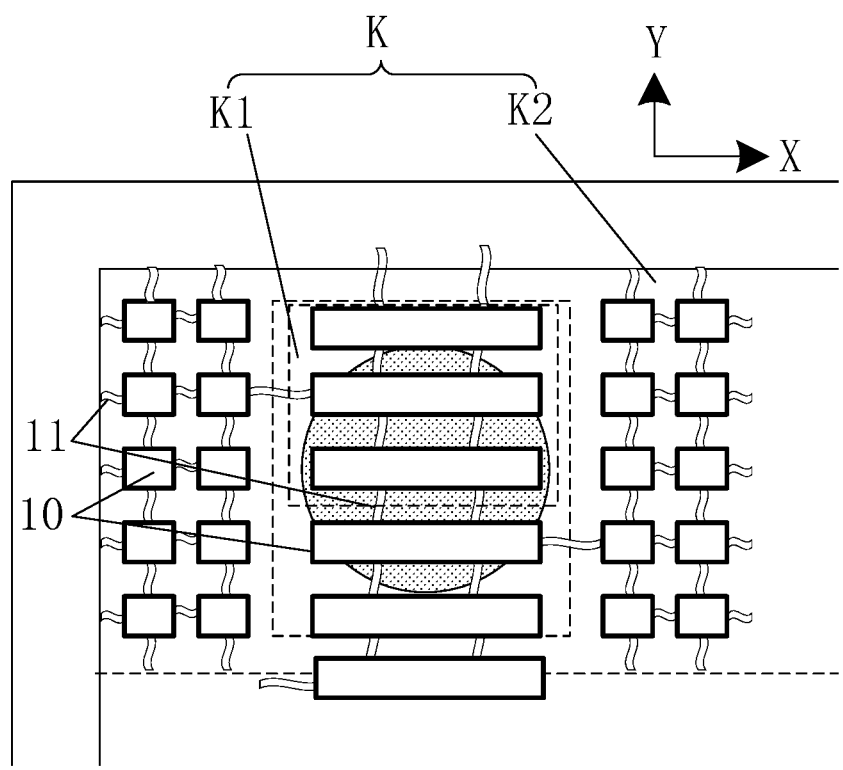
FIG. 24 illustrates a portion of another exemplary stretchable display area K consistent with various disclosed embodiments of the present disclosure.
Figure 25:
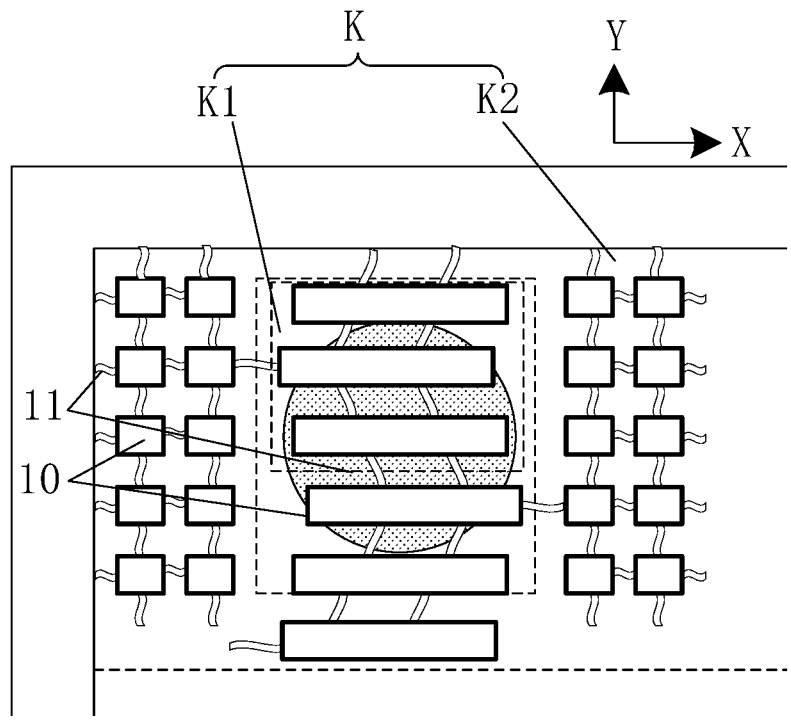
FIG. 25 illustrates a portion of another exemplary stretchable display area K consistent with various disclosed embodiments of the present disclosure.

In one embodiment of the present disclosure, each island-shaped structure row in the same island-shaped structure row group may be connected to the second stretchable display area K2. In some embodiments, there may be other configurations. FIG. 24 illustrates a portion of another exemplary stretchable display area K under a non-stretched state consistent with various disclosed embodiments of the present disclosure. FIG. 25 illustrates a portion of another exemplary stretchable display area K under a stretched state consistent with various disclosed embodiments of the present disclosure. As shown in FIGS. 24-25, at least one island-shaped structure row in the same island-shaped structure row group may not be connected to the second stretchable display area K2, while two adjacent island-shaped structure rows may still need to be connected by the stretchable bridges 11 is connected. In such a configuration, the manufacturing process and design may be simplified without changing the number of stretchable bridges 11 between island-shaped structure rows (i.e., the number of stretchable bridges 11 in different row intervals may be the same, and the adjacent stretchable bridges 11 along the X direction may be aligned under the non-stretched state). Further, the stretchable bridges 11 under the non-stretched state may be more evenly distributed, and may be more stable in structure.

Further, under the non-stretched state, the stretchable bridges 11 between two adjacent island-shaped structure rows may extend along the second direction Y. Under the stretched state, as shown in FIG. 25, the extension direction of the stretchable bridges 11 between the two adjacent island-shaped structure rows may no longer be the second direction Y. In particular, the stretchable bridges 11 may be inclined to the side of the stretching such that the stretchable bridges 11 between the two adjacent island-shaped structure rows may not be aligned under the stretched state. Further, the stretchable bridges 11 between two adjacent island-shaped structure rows in the same group may not be aligned such that the first opening Z1 formed by the rows of island-shaped structures and the stretchable bridges 11 may not have a regular shape, such as a square, etc. Accordingly, the diffraction phenomenon of light at the opening Z1 may be further reduced.

Figure 26:
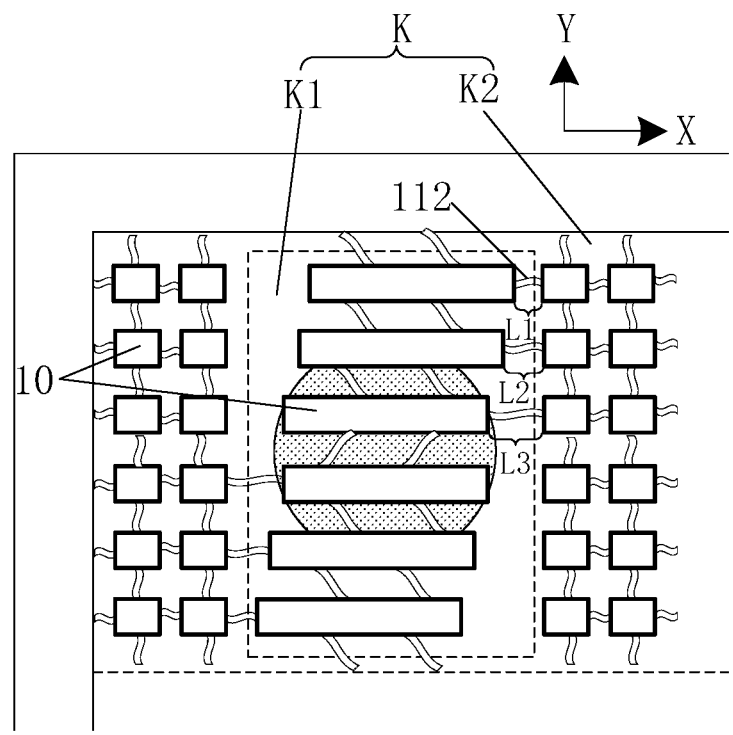
FIG. 26 illustrates a portion of another exemplary stretchable display area K consistent with various disclosed embodiments of the present disclosure.

FIG. 26 is a schematic diagram of a portion of another exemplary stretchable display area K consistent with various disclosed embodiments of the present disclosure. As shown in FIG. 26, in a same island-shaped structure row group, the length of the stretchable bridges between adjacent island-shaped structure rows along the first direction X and the length of the stretchable bridges between adjacent island-shaped structures 10 in the stretchable display area K2 and adjacent to the adjacent island-shaped structure rows along the first direction X may be different. Such a configuration may further increase the area of the openings Z1 in the first stretchable display area K1, and the light transmittance of the region of the under-screen camera P may be increased.

Further, the irregularity of the openings Z1 in the first stretchable display area K1 may be further increased, and the light diffraction phenomenon at the openings Z1 may be further reduced. For example, the length L1 of the stretchable bridge between the island-shaped structures 10 in the first row and the island-shaped structure 10 adjacent to it in the second stretchable display area K2 and the length L2 of the stretchable bridge between the island-shaped structure 10 in the stretchable display area K2 and adjacent to the island-shaped structure 10 in the second stretchable display area K2 may be different.

It should be noted that setting the length of the stretchable bridges along the first direction X between the island-shaped structures 10 in different rows and island-shaped structures 10 in the second stretchable display area K2 and adjacent to the island-shaped structures 10 in different rows to be different may have a few functions. Firstly, it may have a transition function. Because the stress direction of two adjacent island-shaped structure row groups under the stretched state may be different, the stress of the stretchable bridges between two adjacent island-shaped structure rows of different island-shaped structure row groups may be larger to make the stretchable bridges of two adjacent island-shaped structure rows of different island-shaped structure row groups to have a greater length. Thus, the fracture of the stretchable bridges of two adjacent island-shaped structure rows of different island-shaped structure row groups may be avoided; and the stability of stretching may be improved. On the other hand, such a configuration may cause the openings Z1 in the first stretchable display area K1 not to have a regular shape under a stretched state; and the light diffraction phenomenon at the first openings Z1 may be further reduced.

Further, as shown in FIG. 26, the stretchable bridges 11 may include a third stretchable bridge 112, and the third stretchable bridge 112 may be disposed between an island-shaped structure row and the island-shaped structure 10 adjacent to it in the second stretchable display area K2. In the same island-shaped structure row group, in the two island-shaped structure rows adjacent to other, the length of the third stretchable bridge 112 connected by at least one island-shaped structure row along the first direction X may be greater than the length of the third stretchable bridge 112 connected by other island-shaped structures along the first direction X to further increase the area of the openings Z1 in the first stretchable display area K1, and increase the light transmittance of the region of the under-screen camera P. Further, the irregularity of the openings Z1 in the first stretchable display area K1 may be further increased, and the light diffraction phenomenon at the openings Z1 may be further reduced.

Further, as shown in FIG. 26, in the two island-shaped structure rows adjacent to the other island-shaped structure row groups, only the length of one third stretchable bridge 112 connected by the island-shaped structure row along the first direction X may be greater than the length of the third stretchable bridge 112 connected with other island-shaped structure along the first direction X. Further, along the direction away from the other island-shaped structure row group, the lengths of the third stretchable bridges 112 along the first direction X may sequentially decrease, such as L3>L2>L1.

Figure 27:
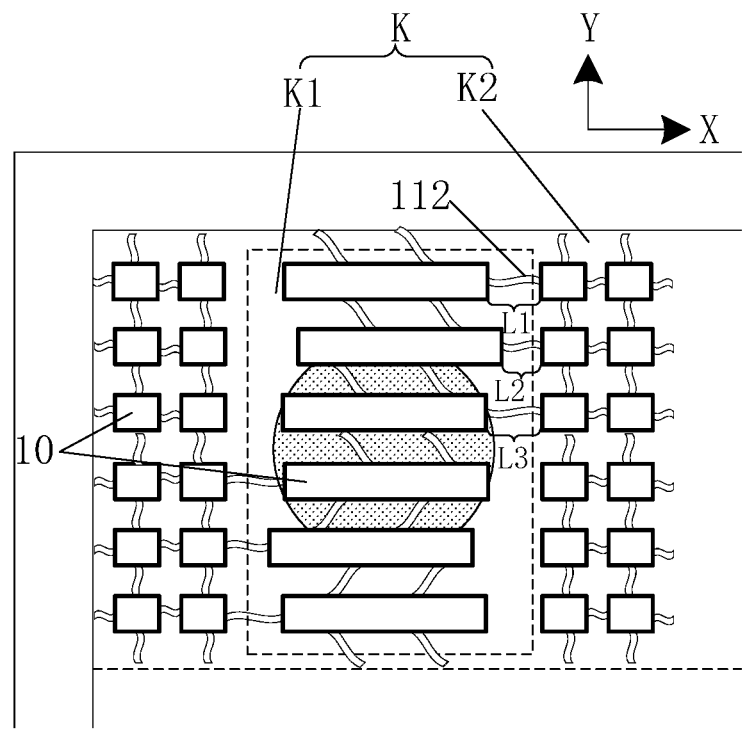
FIG. 27 illustrates a portion of another exemplary stretchable display area K consistent with various disclosed embodiments of the present disclosure.

FIG. 27 is a schematic diagram of a portion of another exemplary stretchable display area K consistent with various disclosed embodiments of the present disclosure. As shown in FIG. 27, in some embodiments, in the two island-shaped structure rows adjacent to other island-shaped structure row groups, the length of the third stretchable bridge 112 connected by the two island-shaped structure rows along the first direction X may be greater than the lengths of the third stretchable bridges 112 connected by other island-shaped structure rows along the first direction X. Further, along the direction away from the other island-shaped structure row groups, the lengths of the third stretchable bridges 112 along the first direction X may decrease first, and then increase sequentially, such as L3>L2, L1>L2.

Figure 28:
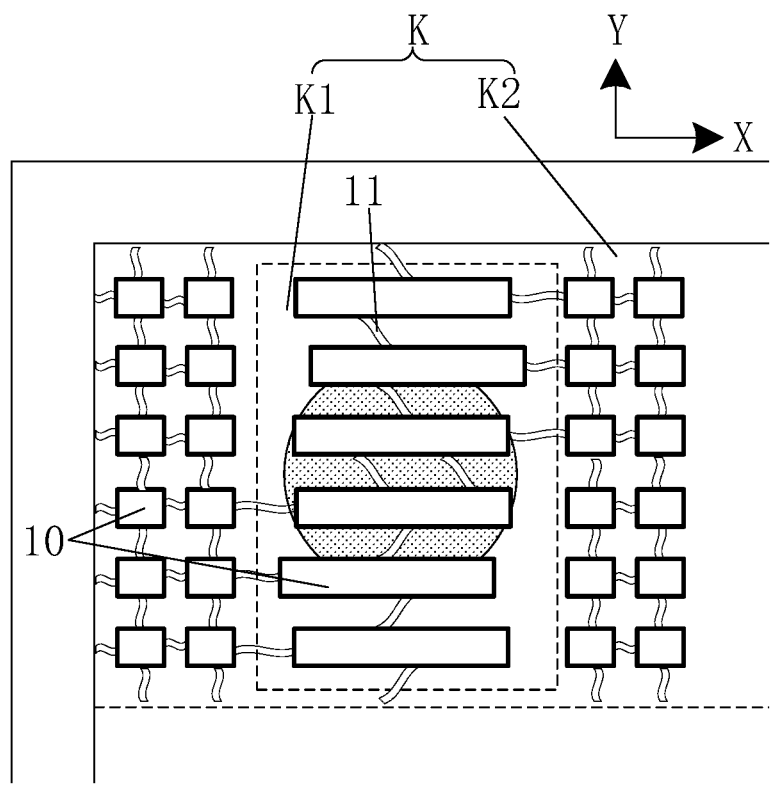
FIG. 28 illustrates a portion of another exemplary stretchable display area K consistent with various disclosed embodiments of the present disclosure.

FIG. 28 is a schematic diagram of a portion of another stretchable display area K consistent with various disclosed embodiments of the present disclosure. As shown in FIG. 28, in one embodiment of the present disclosure, the number of stretchable bridges 11 between adjacent island-shaped structure row groups may be different from the number of stretchable bridges 11 between two rows of island-shaped structures 10 in the same island-shaped structure row group. As shown in FIG. 28, the number of stretchable bridges 11 between adjacent island-shaped structure row groups may be 2, and the number of stretchable bridges 11 between two rows of island-shaped structures 10 in the same island-shaped structure row group may be 1 so as to increase the irregularity of the openings Z1 in the first stretchable display area K1, and further reduce the light diffraction phenomenon at the openings Z1.

In some embodiments of the present disclosure, other setting methods may be used to make the first stretchable display area K1 more stretchable than the second stretchable display area K2 such that the opening Z1 in the first stretchable display area K1 may irregularities.

Figure 29:
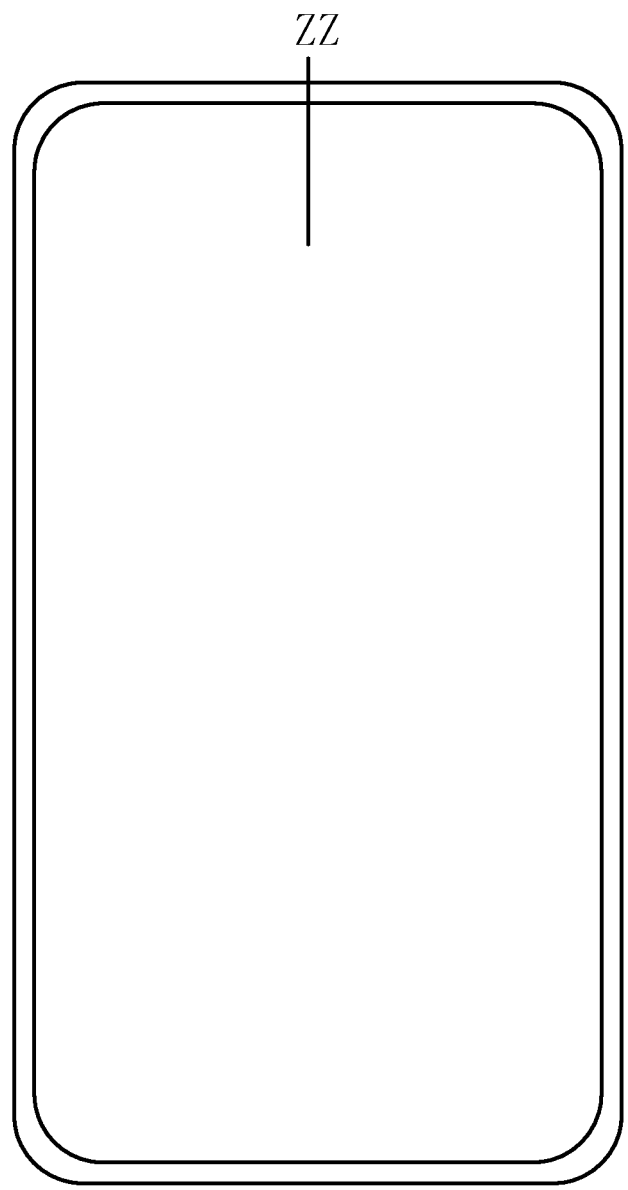
FIG. 29 illustrates an exemplary display device consistent with various disclosed embodiments of the present disclosure.

The present disclosure also provides a display device. FIG. 29 is a schematic diagram of an exemplary display device consistent with various disclosed embodiments of the present disclosure. The display device ZZ may include a display panel. The display panel may be a present disclosed display panel described in any of the above embodiments, or other appropriate display panel. The display device may include, but is not limited to, a full-screen mobile phone, a tablet computer, and a digital camera, etc.

The embodiments in this specification are described in a progressive manner. Each embodiment focuses on the differences from other embodiments. The same and similar parts between the embodiments may be referred to each other. The above description of the disclosed embodiments enables those skilled in the art to implement or use the present disclosure. Various modifications to these embodiments will be apparent to those skilled in the art, and the general principles defined herein can be implemented in other embodiments without departing from the spirit or scope of the present disclosure. Therefore, the present disclosure will not be limited to the embodiments shown in this document, but should conform to the widest scope consistent with the principles and novel features disclosed in this disclosure.

Although some specific embodiments of the present disclosure have been described in detail through examples, those skilled in the art should understand that the above examples are only for illustration, not for limiting the scope of the present disclosure. Those skilled in the art should understand that the above embodiments can be modified without departing from the scope and spirit of the present invention. The scope of the invention is defined by the appended claims.

What is claimed is:

1. A display panel, comprising:
   a stretchable display area,
   wherein:

the stretchable display area includes a plurality of island-shaped structures and a plurality of stretchable bridges;

a stretchable bridge of the plurality of stretchable bridges is configured to connect adjacent island-shaped structures of the plurality of island-shaped structures;

at least one pixel is disposed on an island-shaped structure of the plurality of island-shaped structures;

the stretchable display area includes a first stretchable display area and a second stretchable display area adjacent to the first stretchable display area;

the first stretchable display area is disposed corresponding to an under-screen camera; and a stretchable degree of the first stretchable display area is greater than a stretchable degree of the second stretchable display area.

2. The display panel according to claim 1, wherein:

a number of island-shaped structures of the plurality of island-shaped structure and a number of the plurality of stretchable bridges form an opening;

an amount of stretch deformation of the opening in the first stretchable display area is greater than an amount of stretch deformation of the opening of in the second stretchable display area such that the stretchable degree of the first stretchable display area is greater than the stretchable degree of the second display area.

3. The display panel according to claim 1, wherein:

a number of island-shaped structures of the plurality of island-shaped structures and a number of island-shaped structures of the plurality of stretchable bridges form an opening; and a length of a shortest side of the opening in the first stretchable display area is greater than approximately 100 μm.

4. The display panel according to claim 1, wherein:

an amount of stretch deformation of a stretchable bridge of the plurality of stretchable bridges in the first stretchable display area is greater than an amount of stretch deformation of a stretchable bridge of the plurality of stretchable bridges in the second stretchable display area such that the stretchable degree of the first stretchable display area is greater than the stretchable degree of the second stretchable display area.

5. The display panel according to claim 4, wherein:

a shape of the stretchable bridge in the first stretchable display area is different from a shape of the stretchable bridge in the second stretchable display area, a shape difference including a length difference, a width difference and/or a height difference; and/or a layer number of film layers of the stretchable bridge in the first stretchable display area is different from a layer number of film layers of the stretchable bridge in the second stretchable display area; and/or a material of the stretchable bridge in the first stretchable display area is different from a material of the stretchable bridge in the second stretchable display area.

6. The display panel according to claim 1, wherein:

a length of an island-shaped structure of the plurality of island-shaped structures in the first stretchable display area along a first direction is greater than a length of an island-shaped structure of the plurality of island-shaped structures in the second stretchable display area along a first direction.

7. The display panel according to claim 1, wherein:

the plurality of stretchable bridges include a first stretchable bridge;

the first stretchable bridge connects adjacent island-shaped structures of the plurality of the island-shaped structures along a second direction;

the second direction intersects the first direction; and in the first stretchable display area, at least two adjacent island-shaped structures are connected through a plurality of first stretchable bridges.

8. The display panel according to claim 1, wherein:

in the first stretchable display area, a number of island-shaped structures of the plurality of island-shaped structures are arranged as an array along a first direction and a second direction intersecting the first direction;

a first gap extending along the first direction is located between two adjacent island-shaped structure rows of the number of island-shaped structures in the array;

a second gap extending along the second direction is located between two adjacent island-shaped structure columns of the number of island-shaped structures in the array; and numbers of stretchable bridges in at least two first gaps are different, and/or numbers of stretchable bridges in at least two second gaps are different.

9. The display panel according to claim 1, wherein:

in the first stretchable display area, a number of island-shaped structures of the plurality of island-shaped structures are arranged as an array along a first direction and a second direction intersecting the first direction;

a first gap extending along the first direction is located between two adjacent island-shaped structure rows of the number of island-shaped structures in the array;

a second gap extending along the second direction is located between two adjacent island-shaped structure columns of the number of island-shaped structures in the array; and stretchable bridges in at least two first gaps have a staggered arrangement along the second direction, and/or stretchable bridges in at least two second gaps have a staggered arrangement along the first direction.

10. The display panel according to claim 1, wherein:

island-shaped structures of the plurality of island-shaped structure in the second stretchable display area are uniformly distributed as an array; and two adjacent island-shaped structures are connected to each other by a stretchable bridge of the plurality of stretchable bridges.

11. The display panel according to claim 1, wherein:

in the first stretchable display area, a number of island-shaped structures of the plurality of island-shaped structures are arranged as an array along a first direction and a section intersecting the first direction;

in the first stretchable display area, two adjacent island-shaped structures of the plurality of island-shaped structures along the first direction are connected to each other by a stretchable bridge of the plurality of stretchable bridges; and two adjacent island-shaped structures of the number of island-shaped structures along the second direction are not connected.

12. The display panel according to claim 1, wherein:

in the first stretchable display area, a number of island-shaped structures of the plurality of island-shaped structures are arranged as an array along a first direction and a second direction intersecting the first direction;

in the first stretchable display area, two adjacent island-shaped structures of the plurality of island-shaped structures along the second direction are connected to each other a stretchable bridge of the plurality of stretchable bridges;

two adjacent island-shaped structures of the number of island-shaped structures along the first direction are connected to each other by a stretchable bridge of the plurality of stretchable bridges; and among island-shaped structures in the first stretchable display area adjacent to the second stretchable display area, at least a partial number of the island-shaped structures in the first stretchable display are not connected to island-shaped structures in the second stretchable display area adjacent thereto.

13. The display panel according to claim 1, wherein:

in the first stretchable display area, a number of island-shaped structures of the plurality of island-shaped structures are arranged as an array along a first direction and a second direction intersecting the first direction;

configuring the first direction as a row direction of the array, in the first stretchable display area, two adjacent island-shaped structures of the plurality of island-shaped structures in a same row of the array are connected to each other by a stretchable bridge of the plurality of stretchable bridges;

at least one row of island-shaped structures are connected to island-shaped structures in the second stretchable display area at one side of the first stretchable display area and adjacent to the at least one row of island-shaped structures by stretchable bridges of the plurality of stretchable bridges; and at least another row of island-shaped structures are connected to island-shaped structures in the second stretchable display area at another side of the first stretchable display area and adjacent to the at least another row of island-shaped structures by stretchable bridges of the plurality of stretchable bridges.

14. The display panel according to claim 13, wherein in the first stretchable display area:

two adjacent island-shaped structure rows connecting the second stretchable display area at different sides are connected by a second stretchable bridge;

the second stretchable bridge includes a first end and a second end respectively connecting to the adjacent island-shaped structure rows;

under a non-stretched state, a component of a direction, along which the first end points to the second end, on an arrangement direction of the first stretchable display area and the second stretchable display area is referred to as a third direction; and under a stretched state, a component of a movement direction of the first end relative to the second end on the arrangement direction of the first stretchable display area and the second stretchable display area is same as the third direction.

15. The display panel according to claim 13, wherein:

in the first stretchable display area, at least two rows of island-shaped structures form an island-shaped structure row group; and at least two adjacent island-shaped structure row groups are connected to the second stretchable display area at two different sides, respectively.

16. The display panel according to claim 15, wherein:

in a same island-shaped structure row group, lengths of stretchable bridges between different island-shaped structure rows and island-shaped structures in the second stretchable display area adjacent thereto are different.

17. The display panel according to claim 15, wherein:

the plurality of stretchable bridges include a third stretchable bridges disposed between an island-shaped structure row and an island-shaped structure in the second stretchable display areas adjacent thereto; and in a same island-shaped structure row group, and among two island-shaped structure rows adjacent to another island-shaped structures rows, a length of a third stretchable bridge connected to at least one of the two island-shaped structure rows is greater than a length of a third stretchable bridge connecting to the another island-shaped structure row.

18. The display panel according to claim 15, wherein:

a number of stretchable bridges between two adjacent island-shaped structure row groups is different from a number of stretchable bridges between two rows of island-shaped structures in a same island-shaped structure row.

19. The display panel according to claim 1, wherein:

at least a portion of the first stretchable display area extends to a side of the display panel; and at least a portion of the second stretchable display area is located between the first stretchable display area and the side of the display panel.

20. The display panel according to claim 1, wherein:

the display panel also includes a non-stretchable display area;

the non-stretchable display area is adjoined to the stretchable display area; and at least a portion of the second stretchable display area is located between the non-stretchable display area and the first stretchable display area.

21. The display panel according to claim 13, wherein:

the stretchable display area and the non-stretchable display area are sequentially arranged along the second direction.

22. The display panel according to claim 13, wherein:

the first stretchable display area and the second stretchable display area are sequentially arranged along the first direction.

23. The display panel according to claim 1, wherein:

island-shaped structures of the plurality of island-shaped structures in the first stretchable display area are strip island-shaped structures arranged along a row direction and extending along a column direction.

24. The display panel according to claim 1, further comprising:

a stretch controller, configured to control the stretchable display area to be at a stretched state when the under-screen camera is in operation, and to control the stretchable display area to be at a non-stretched state when the under-screen camera is not in operation.

25. A touch display device, comprising:

a display panel, including a stretchable display area, wherein:

the stretchable display area includes a plurality of island-shaped structures and a plurality of stretchable bridges;

a stretchable bridge of the plurality of stretchable bridges is configured to connect adjacent island-shaped structures of the plurality of island-shaped structures;

at least one pixel is disposed on an island-shaped structure of the plurality of island-shaped structures;

the stretchable display area includes a first stretchable display area and a second stretchable display area adjacent to the first stretchable display area;

the first stretchable display area is disposed corresponding to an under-screen camera; and a stretchable degree of the first stretchable display area is greater than a stretchable degree of the second stretchable display area.

* * * * *